(12) United States Patent
Rodriguez et al.

(10) Patent No.: US 7,085,150 B2
(45) Date of Patent: Aug. 1, 2006

(54) METHODS FOR ENHANCING PERFORMANCE OF FERROELECTRIC MEMORY WITH POLARIZATION TREATMENT

(75) Inventors: John A. Rodriguez, Richardson, TX (US); Kezhakkedath R. Udayakumar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 35 days.

(21) Appl. No.: 11/017,572

(22) Filed: Dec. 20, 2004

(65) Prior Publication Data

US 2006/0133129 A1 Jun. 22, 2006

(51) Int. Cl.
*G11C 11/22* (2006.01)

(52) U.S. Cl. .................. 365/145; 365/189.09; 365/145

(58) Field of Classification Search ................ None
See application file for complete search history.

(56) References Cited

U.S. PATENT DOCUMENTS

| | | | |
|---|---|---|---|
| 5,661,730 | A | 8/1997 | Mitra et al. |
| 5,969,935 | A | 10/1999 | Kammerdiner et al. |
| 6,008,659 | A | 12/1999 | Traynor |
| 6,238,933 | B1 | 5/2001 | Sun et al. |
| 6,529,398 | B1 * | 3/2003 | Nair et al. .................. 365/145 |
| 6,541,375 | B1 | 4/2003 | Hayashi et al. |

OTHER PUBLICATIONS

"Influence of the Crystallization Thermal Treatment on the Structural and Electrical Properties of PZT Thin Films", Antonio Leondino Bacichetti Junior, Manuel Henrique Lente, Ricardfo Goncalves Mendes, Pedro Iris Paulin Filho, and Jose Antonio Eiras, Materials Research, vol. 7, No. 2, 2004, pp. 363-367.
"Polarization as a Driving Force in Accelerated Retention Measurements on Ferroelectric Thin Films", S. D. Traynor, IEEE., 1998, pp. 15-18.
"Fatigue and Retention Reliability of Low Voltage PZT Ferroelectic Films", J. Rodriguez, S. Aggarwal, S. Martin, S. Summerfelt, K.R. Udayakumar, T. Moise, R. Bailey, F. CHU, S. Sun, G. Fox and T. Davenport, Abstract/Conference presentation, Mar. 2003, 2 pgs.

* cited by examiner

*Primary Examiner*—David Lam
(74) *Attorney, Agent, or Firm*—Jacqueline J. Garner; Wade James Brady, III; Frederick J. Telecky, Jr.

(57) ABSTRACT

The present invention facilitates data retention lifetimes for ferroelectric devices by improving switched polarization of ferroelectric memory cells. A ferroelectric memory device comprising ferroelectric memory cells is provided (702). A duration for applying a DC bias to the ferroelectric memory cells is selected (704) according to at least a desired switched polarization improvement. A magnitude for applying the DC bias to the ferroelectric memory cells is also selected (706) according to at least the desired switched polarization improvement. Further, an elevated temperature is selected for applying the DC bias to the ferroelectric memory cells is also selected (708) according to at least the desired switched polarization improvement. Subsequently, the DC bias is applied to the ferroelectric memory cells (710), which activates one or more inactive domains within the ferroelectric memory cells and increases initial polarization values.

20 Claims, 15 Drawing Sheets

METHODS FOR ENHANCING PERFORMANCE OF FERROELECTRIC MEMORY WITH POLARIZATION TREATMENT

FIELD OF THE INVENTION

The present invention relates generally to memory devices, and more particularly, to systems and methods that facilitate general performance, including data retention lifetimes, of ferroelectric memory devices.

BACKGROUND OF THE INVENTION

Several trends exist today in the semiconductor device fabrication industry and the electronics industry. Devices are continuously getting smaller and requiring less power. A reason for this is that more personal devices are being fabricated which are very small and portable, thereby relying on a small battery as its supply source. For example, cellular phones, personal computing devices, and personal sound systems, personal digital assistants, and the like are devices that are in great demand in the consumer market. In addition to being smaller and more portable, personal devices are requiring more computational power and on-chip memory. In light of all these trends, there is a need in the industry to provide a computational device that has a fair amount of memory and logic functions integrated onto the same semiconductor chip. Preferably, this memory will be configured such that if the battery dies, the contents of the memory will be retained. Such a memory device which retains its contents while a signal is not continuously applied to it is called a non-volatile memory. Examples of conventional non-volatile memory include: electrically erasable, programmable read only memory ("EEPROM") and FLASH EEPROM.

A ferroelectric memory (FRAM) is a non-volatile memory that utilizes a ferroelectric material as the capacitor dielectric situated between a bottom electrode and a top electrode. Both read and write operations are performed for a FRAM. The memory size and memory architecture affect the read and write access times of a FRAM. Table 1 illustrates exemplary differences between different memory types.

TABLE 1

| Property | SRAM | Flash | DRAM | FRAM (Demo) |
|---|---|---|---|---|
| Voltage | >0.5 V | Read > 0.5 V Write (12 V) (±6 V) | >1 V | 3.3 V |
| Special Transistors | NO | YES (High Voltage) | YES (Low Leakage) | NO |
| Write Time | <10 ns | 100 ms | <30 ns | 60 ns |
| Write Endurance | >$10^{15}$ | <$10^5$ | >$10^{15}$ | >$10^{13}$ |
| Read Time (single/multi bit) | <10 ns | <30 ns | <30 ns/<2 ns | 60 ns |
| Read Endurance | >$10^{15}$ | >$10^{15}$ | >$10^{15}$ | >$10^{13}$ |
| Added Mask for embedded | 0 | ~6–8 | ~6–8 | ~3 |
| Cell Size (F ~ metal pitch/2) | ~80 $F^2$ | ~8 $F^2$ | ~8 $F^2$ | ~18 $F^2$ |
| Architecture | NDRO | NDRO | DRO | DRO |
| Non volatile | NO | YES | NO | YES |
| Storage | I | Q | Q | P |

The non-volatility of an FRAM is due to the bi-stable characteristic of the ferroelectric memory cell. Two types of memory cells are typically used, a single capacitor memory cell and a dual capacitor memory cell. The single capacitor memory cell (referred to as a 1T/1C or 1C memory cell) requires less silicon area (thereby increasing the potential density of the memory array), but is less immune to noise and process variations. Additionally, a 1C cell requires a voltage reference for determining a stored memory state. The dual capacitor memory cell (referred to as a 2T/2C or 2C memory cell) requires more silicon area, and it stores complementary signals allowing differential sampling of the stored information. The 2C memory cell is more stable than a 1C memory cell.

As illustrated in prior art FIG. 1, a 1T/1C FRAM cell 10 includes one transistor 12 and one ferroelectric storage capacitor 14. A bottom electrode of the storage capacitor 14 is connected to a drain terminal 15 of the transistor 12. The 1T/1C cell 10 is read by applying a signal to the gate 16 of the transistor (word line WL) (e.g., the Y signal), thereby connecting the bottom electrode of the capacitor 14 to the source of the transistor (the bit line BL) 18. A pulse signal is then applied to the top electrode contact (the plate line or drive line DL) 20. The potential on the bit line 18 of the transistor 12 is, therefore, the capacitor charge divided by the bit line capacitance. Since the capacitor charge is dependent upon the bi-stable polarization state of the ferroelectric material, the bit line potential can have two distinct values. A sense amplifier (not shown) is connected to the bit line 18 and detects the voltage associated with a logic value of either 1 or 0. Frequently the sense amplifier reference voltage is a ferroelectric or non-ferroelectric capacitor connected to another bit line that is not being read. In this manner, the memory cell data is retrieved.

A characteristic of the shown ferroelectric memory cell is that a read operation is destructive. The data in a memory cell is then rewritten back to the memory cell after the read operation is completed. If the polarization of the ferroelectric is switched, the read operation is destructive and the sense amplifier must rewrite (onto that cell) the correct polarization value as the bit just read from the cell. This is similar to the operation of a DRAM. One difference from a DRAM is that a ferroelectric memory cell will retain its state until it is interrogated, thereby eliminating the need of refresh.

As illustrated, for example, in prior art FIG. 2, a 2T/2C memory cell 30 in a memory array couples to a bit line 32 and an inverse of the bit line ("bit line-bar") 34 that is common to many other memory types (for example, static random access memories). Memory cells of a memory block are formed in memory rows and memory columns. The dual capacitor ferroelectric memory cell comprises two transistors 36 and 38 and two ferroelectric capacitors 40 and 42, respectively. The first transistor 36 couples between the bit line 32 and a first capacitor 40, and the second transistor 38 couples between the bit line-bar 34 and the second capacitor 42. The first and second capacitors 40 and 42 have a common terminal or plate (the drive line DL) 44 to which a signal is applied for polarizing the capacitors.

In a write operation, the first and second transistors 36 and 38 of the dual capacitor ferroelectric memory cell 30 are enabled (e.g., via their respective word line 46) to couple the capacitors 40 and 42 to the complementary logic levels on the bit line 32 and the bit line-bar 34 corresponding to a logic state to be stored in memory. The common terminal 44 of the capacitors is pulsed during a write operation to polarize the dual capacitor memory cell 30 to one of the two logic states.

In a read operation, the first and second transistors 36 and 38 of the dual capacitor memory cell 30 are enabled via the word line 46 to couple the information stored on the first and second capacitors 40 and 42 to the bar 32 and the bit line-bar 34, respectively. A differential signal (not shown) is thus generated across the bit line 32 and the bit line-bar 34 by the dual capacitor memory cell 30. The differential signal is sensed by a sense amplifier (not shown) that provides a signal corresponding to the logic level stored in memory.

As stated above, a ferroelectric capacitor includes a ferroelectric layer as a dielectric material sandwiched between a bottom electrode and a top electrode. The various read/write operations described supra utilize the ferroelectric properties, polarization, of the ferroelectric layer. However, over time, the ferroelectric properties of the ferroelectric capacitor can alter.

Data retention is the ability of a memory cell, particularly a non-volatile memory cell, to properly maintain stored data. Proper operation, including data retention, of ferroelectric memory devices depends on the bi-stable characteristic of the ferroelectric memory cell described above. However, over time, the bi-stable characteristic can degrade significantly and negatively affect data retention. Thus, ferroelectric memory devices can, over time, become unusable for some applications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to the fabrication and modification of ferroelectric memory devices, which are either stand-alone devices or integrated onto a semiconductor chip that includes other device types. Additionally, the present invention relates to improving data retention lifetimes without altering fabrication processes and materials employed therein.

The present invention can improve and/or modify data retention lifetimes for ferroelectric devices by applying a polarization treatment across ferroelectric capacitors, which typically include inactive domains within their ferroelectric materials, for a relatively long duration. The polarization treatment includes a relatively constant DC bias voltage or DC pulses. Application of the polarization treatment causes inactive domains to become active, thereby improving switching polarization of the ferroelectric capacitors.

In accordance with one aspect of the invention, a ferroelectric memory device comprising ferroelectric memory cells that include ferroelectric material comprising one or more inactive domains is provided. A duration for applying a DC bias to the ferroelectric memory cells is selected according to at least a desired switched polarization improvement. A magnitude of the applied DC bias to the ferroelectric memory cells is also selected according to at least the desired switched polarization improvement. Further, an elevated temperature is selected for applying the DC bias to the ferroelectric memory cells according to the at least the desired switched polarization improvement. Subsequently, the DC bias is applied to the ferroelectric memory cells, which activates one or more inactive domains within the ferroelectric memory cells and increases initial polarization values, thereby improving the data retention lifetime.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
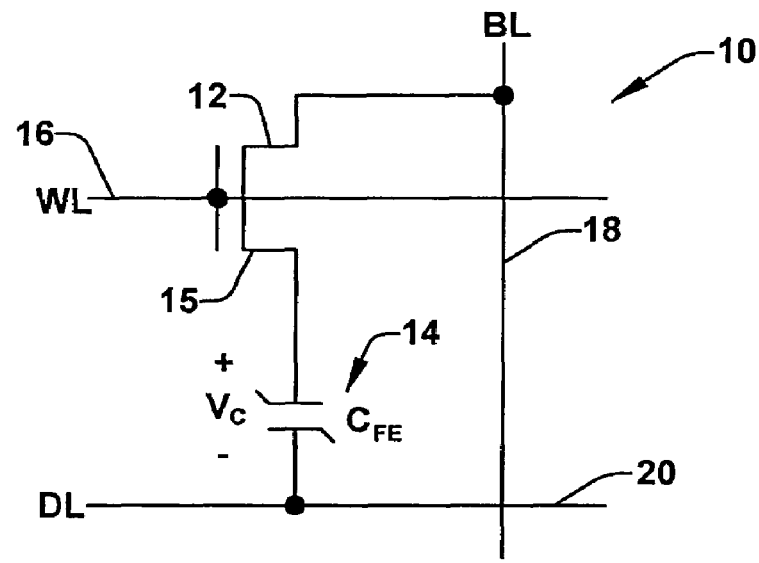
FIG. 1 is a schematic view of a conventional 1T/1C FRAM cell.

The present invention will now be described with respect to the accompanying drawings in which like numbered elements represent like parts. The figures provided herewith and the accompanying description of the figures are merely provided for illustrative purposes. One of ordinary skill in the art should realize, based on the instant description, other implementations and methods for fabricating the devices and structures illustrated in the figures and in the following description.

The present invention relates to the fabrication and modification of ferroelectric memory devices, which are either stand-alone devices or integrated onto a semiconductor chip that includes other device types. Additionally, the present invention relates to improving general performance of ferroelectric memory devices, including data retention lifetimes and the like, by an electrical based polarization treatment without altering fabrication processes and materials employed therein.

Ferroelectric memory (FRAM) devices are non-volatile, as discussed supra. However, the inventors of the present invention appreciate that over time and/or at elevated temperatures, ferroelectric memory devices tend to preferentially stabilize in a stored state, thereby reducing the lifetime of the opposite state. As a result, data retention capabilities for ferroelectric memory devices can degrade over time and/or at elevated temperatures. The length of time until devices are expected to have their data retention capabilities critically degraded is referred to as their data retention lifetime and can be considered to be an estimate of a device's actual lifetime.

A characteristic of ferroelectric memory devices and their ferroelectric capacitors is switched polarization, which refers to a difference in charge polarization between the two states of the ferroelectric capacitors. Memory circuits of the ferroelectric memory devices require a minimal amount of switched polarization in order to properly determine states of the ferroelectric capacitors and, therefore, determine stored data values. Lower switched polarization can cause a ferroelectric memory cell to fail and/or require costlier sensing circuitry in order to read the stored data values. Additionally, switched polarization for ferroelectric memory cells reduces over time and/or memory operations (e.g., reading and programming). As a result, a lower initial switched polarization reduces data retention lifetimes for affected ferroelectric memory cells.

The inventors of the present invention note that some mechanisms for modifying or improving data retention lifetimes include process development, material/dopant selection, and architecture selection. Processes employed in fabrication can be adjusted in order to reduce defects that lead to loss of signal margin and data retention. Material selection and dopant selection can be adjusted to compensate for defects in processing or fabrication to reduce a rate of imprint or reduce establishing a preferential state. Selection of architectures, such as 2T/2C, can be employed to also improve/modify data retention lifetimes. The present invention is operable to improve data retention lifetimes instead of, or in addition to, the above mechanisms.

Figure 3:
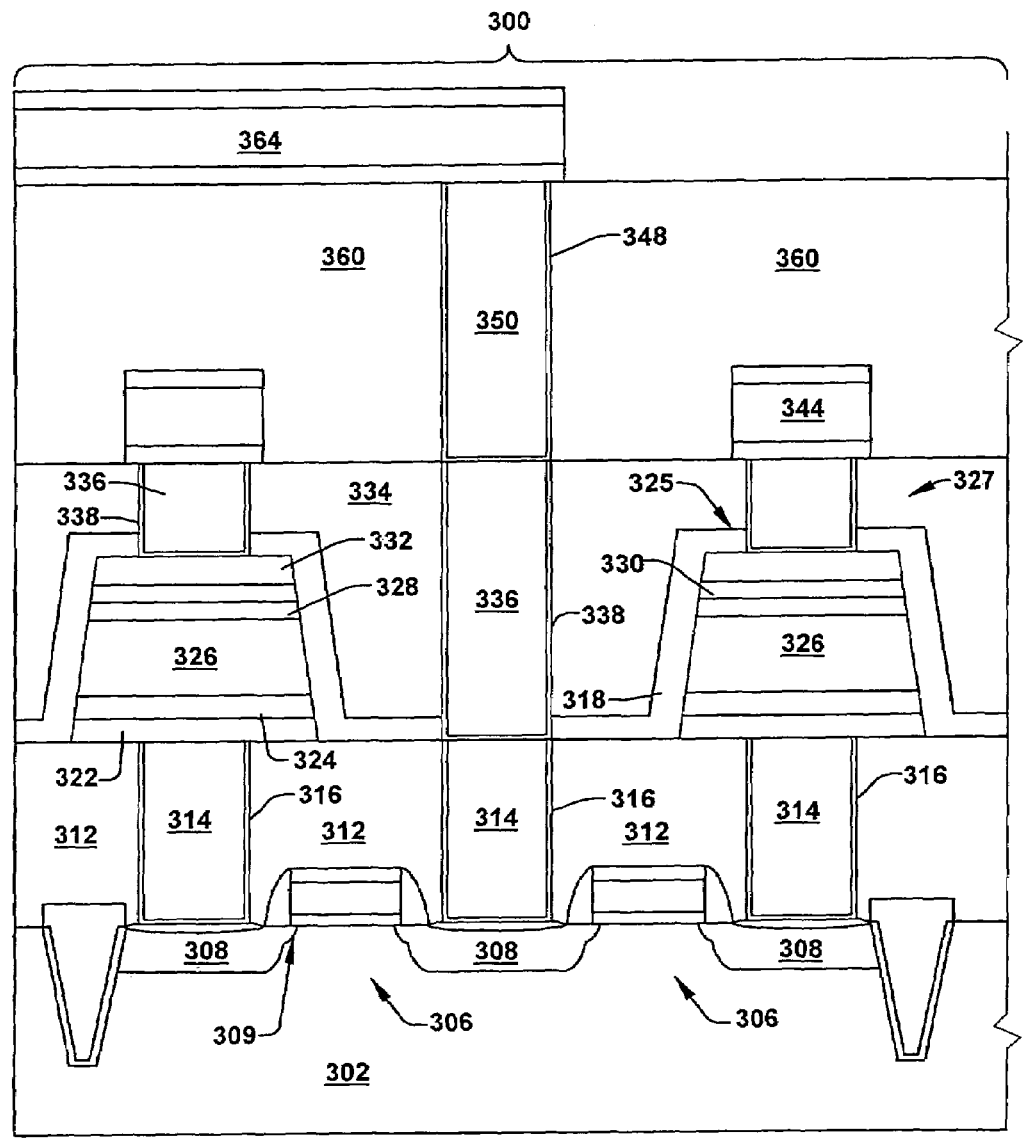
FIG. 3 is a cross sectional view of an exemplary ferroelectric semiconductor device in accordance with an aspect of the present invention.

Referring initially to FIG. 3, a cross section of an exemplary ferroelectric semiconductor device 300 is illustrated in accordance with an aspect of the present invention. The device 300 represents a partially fabricated version of a ferroelectric memory (FRAM) cell in accordance with the present invention. It is appreciated that the device 300 is but one example of many suitable ferroelectric memory devices in accordance with the present invention. Accordingly, it is also appreciated that suitable variations of the device 300 are contemplated in accordance with the present invention.

Gate structures 306 include a gate dielectric (for example, comprising silicon dioxide, an oxynitride, a silicon nitride, BST, PZT, a silicate, any other high-k material, or any combination or stack thereof), a gate electrode (for example, comprising polycrystalline silicon doped either p-type or n-type with a silicide formed on top, or a metal such as titanium, tungsten, TiN, tantalum, TaN or other type metal). The gate structures 306 further comprise side wall insulators (for example, comprising an oxide, a nitride, an oxynitride, or a combination or stack thereof). In general, the generic terms oxide, nitride and oxynitride refer to silicon oxide, silicon nitride and silicon oxy-nitride. The term "oxide" may, in general, include doped oxides as well, such as boron and/or phosphorous doped silicon oxide. Source/drain regions 308 may be formed via, for example, implantation using conventional dopants and processing conditions. Lightly doped drain extensions 309 as well as pocket implants may also be utilized. In addition, the source/drain regions 308 may be silicided (for example, with titanium, cobalt, nickel, tungsten or other conventional silicide material).

A dielectric layer 312 is formed over the entire substrate 302 and is patterned and etched so as to form openings for contacts to the substrate and gate structures 306 to be formed. These openings are filled subsequently with one or more conductive materials, such as a plug 314 (for example, comprising a metal such as tungsten, molybdenum, titanium, titanium nitride, tantalum nitride, or a metal silicide such as Ti, Ni or Co, copper or doped polysilicon). A liner/barrier layer 316 may or may not be formed between the plug 314 and dielectric 312. Such a liner/barrier layer 316 is illustrated in FIG. 3 and comprises, for example, Ti, TiN, TaSiN, Ta, TaN, TiSiN, a stack thereof, or any other conventional liner/barrier material. Preferably, the contacts are formed so as to land on the silicided regions of the source/drain regions and gate structures.

The dielectric layer 312 comprises, for example, $SiO_2$ (doped or undoped with dopants such as boron or phosphorous) possibly with a layer of hydrogen or deuterium containing silicon nitride next to the gate. After deposition of the diffusion barrier 316 it is likely that the barrier will be planarized for improved lithography of overlying layers using a process such as chemical mechanical polishing (CMP). In addition, an added diffusion barrier/etch stop (not shown) may be included near the top surface of layer 312 such as $AlO_x$, AlN, $Si_3N_4$, $TiO_2$, $ZrO_2$, or $TaO_x$ that would be deposited after the planarization process. This diffusion barrier is particularly useful if damascene processes are used to create the via or metallization to the contact. The formation of the plug 314 will require etching through this optional barrier/etch stop.

Formation of metal structures which are situated above the contacts is considered to be part of the back end processes. Other than the specific FRAM process module, the back end process steps may be those standard in the semiconductor industry. The metallization may be, for example, either Al or Cu based. The Al is preferably etched while the Cu is preferably used in a damascene approach. However, etching Cu and Al formed in a damascene process is also possible. According to one example, aluminum metallization will preferably have CVD tungsten plugs or Al plugs, and the Al will preferably be Cu-doped for improved electromigration resistance. Metal diffusion barriers for Al may include, for example, TiN and/or Ti. Copper metallization may have, for example, Cu or W plugs with either Ti, TiN, TiSiN, Ta, tantalum nitride, and/or TaSiN diffusion barriers.

A thin dielectric layer (not shown) may be formed between each of the interlevel dielectric (ILD) layers (layers 312, 334 and 360). If formed, this thin dielectric comprises, for example, silicon nitride, silicon carbide, SiCNO or a silicon oxide (for example, a high-density plasma oxide). In addition, interlevel dielectric layers 312, 334, and 360 may comprise, for example, an oxide, FSG, PSG, BPSG, PETEOS, HDP oxide, a silicon nitride, silicon oxynitride, silicon carbide, silicon carbo-oxy-nitride, a low dielectric constant material (for example, SiLK, porous SiLK, teflon, low-K polymer (possibly porous), aerogel, xerogel, BLACK DIAMOND, HSQ, or any other porous glass material), or a combination or stack thereof.

The interconnects and the metal lines preferably comprise the same material. Plugs 336 and 350 and conductors 344 and 364 comprise a metal material (for example, copper, aluminum, titanium, TiN, tungsten, tungsten nitride, or any combination or stack thereof). A barrier/liner may be formed between the plug and the respective interlevel dielectric layer. If formed, the barrier/liner layer (shown as layers 338 and 348 and liners (not shown) comprise, for example, Ti, TiN, W, tungsten nitride, Ta, tantalum nitride, any conventional barrier/liner layer, or any combination or stack thereof). The interlayer dielectric and plug material should be compatible with the FRAM thermal budget. With existing technology (i.e., one that incorporates a W plug and $SiO_2$ ILD), the FRAM thermal budget should be less than approximately 600 or 650 C, however, the present invention is not limited thereto. If the ILD is modified to include a low dielectric constant ("low K") layer, the FRAM thermal budget may need to be reduced further. The preferred interlayer dielectric 312 is therefore a material that can withstand a thermal budget in excess of 600 C, such as silicon oxide (doped and/or undoped), silicon nitride, and/or silicon oxy-nitride.

Level 327 is added so as to accommodate the FRAM cells (FRAM process module). This FRAM process module allows the creation of ferroelectric or high dielectric constant capacitors to be easily added with maximum thermal budget for the new process module yet not impact the thermal budget of backend process. In particular, this level allows FRAM devices with capacitor under bit line configuration compatible with a high-density memory. However, it is possible, if planarity is not a necessity, to form the FRAM devices while not forming layer 327 in region 305.

An FRAM capacitor, as illustrated in FIG. 3 at reference numeral 325, resides above the interlayer dielectric 312, and comprises several layers. The FRAM capacitor 325 of FIG. 3 comprises an electrically conductive barrier layer 322 upon which a conductive bottom capacitor electrode 324 resides (the terms conductive and insulative are employed to indicate electrically conductive and electrically insulative, respectively, unless indicated otherwise). A capacitor dielectric layer 326, a ferroelectric material, is formed over the bottom electrode 324, and is covered by, for example, a conductive multi-layer top electrode 328, 330. A top portion of the FRAM capacitor 325 comprises a hard mask layer 332 which, may be employed to facilitate the capacitor stack etch. The capacitor stack is covered and/or encapsulated by a sidewall diffusion barrier layer 318.

The FRAM capacitor 325 is programmed to a particular state and baked at a selected temperature for a selected time prior to packaging. This pre-baking imprints a preference for the particular state on the FRAM capacitor 325. As a result, the FRAM capacitor 325 can have an improved data retention lifetime as compared with conventional capacitors that do not undergo such a programming and baking procedure.

Figure 4:
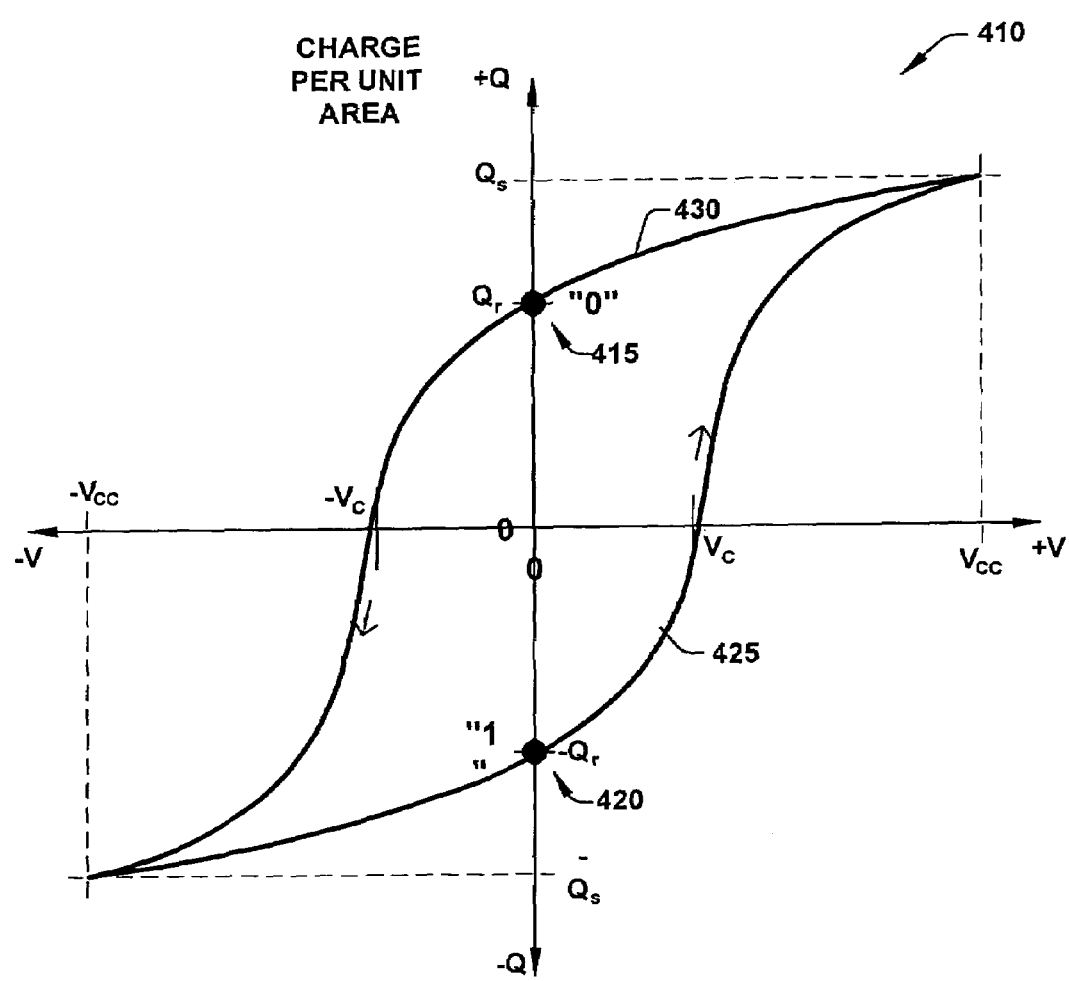
FIG. 4 is plot of an exemplary characteristic hysteresis loop for a ferroelectric capacitor in accordance with an aspect of the present invention.

A plot or graph 410 of an exemplary characteristic hysteresis loop for a ferroelectric capacitor in accordance with an aspect of the present invention is depicted in FIG. 4, and displays the total charge on the ferroelectric capacitor as a function of the applied voltage. Plot 410 illustrates the charge "Q" (in $uC/cm^2$) along a y-axis and the voltage "V" (in kV/cm) along an x-axis. Remnant charge ($Q_r$), saturation charge ($Q_s$), and coercive voltage ($V_c$) are three parameters that characterize the loop. When the voltage applied across the capacitor is 0V, the capacitor assumes one of the two stable states: "0" 415 or "1" 420. The total charge stored on the capacitor is $Q_r$ for a "0" 415 or $-Q_r$ for a "1" 420. A "0" can be switched to a "1" by applying a negative voltage pulse (−Vcc) across the ferroelectric capacitor. By doing so, the total charge on the ferroelectric capacitor is reduced by $2Q_r$, a change of charge that can be sensed by the sense amplifier (amp). Similarly, a "1" can be switched back to a "0" by applying a positive voltage pulse (+Vcc) across the capacitor, hence restoring the capacitor charge to $+Q_r$.

Characteristic curve segment 425 represents the charge path of a ferroelectric capacitor from a "1" state 420, thru $V_{cc}$ as charge is applied, and then thru curve segment 430 to the other stable "0" state 415 as the voltage is relaxed to the ferroelectric capacitor.

Data in a ferroelectric memory cell is read by connecting a reference voltage to a first bit line, connecting the cell capacitor between a complimentary bit line and a plate line signal voltage, and interrogating the cell. There are several suitable techniques to interrogate an FRAM cell. Two suitable interrogation techniques that can be employed are step sensing and pulse sensing. In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage (in a 1T1C configureation) is typically supplied at an intermediate voltage between a voltage ($V_{"0"}$) associated with a capacitor programmed to a binary "0" 415 of FIG. 4, and that of the capacitor programmed to a binary "1" ($V_{"1"}$) 420 (e.g., an intermediate voltage of about ½ $V_{cc}$). The resulting differential voltage at the sense amp terminals represents the data stored in the cell, which is buffered and applied to a pair of local I/O lines.

The transfer of data between the FRAM, the sense amp circuit, and the local data bit lines is controlled by various access transistors, typically MOS devices, with switching signals being provided by control circuitry in the device. In a typical ferroelectric memory read sequence, the two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

FIG. 4 and the accompanying description are provided for illustrative purposes and are not intended to be a complete description of the operation of a ferroelectric capacitor, but merely to highlight some aspects of its operation.

Figure 5A:
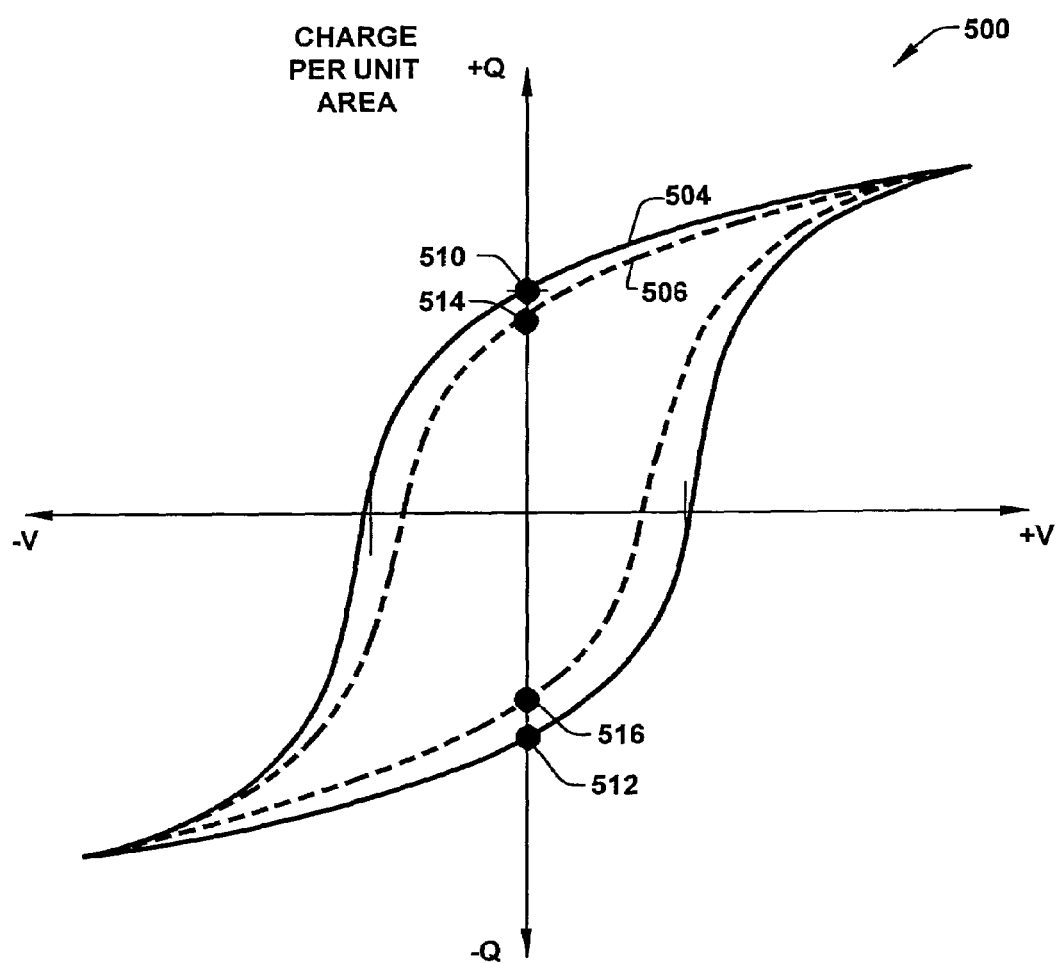
FIG. 5A is a graph illustrating switched polarization vs. applied electric field for an exemplary ferroelectric capacitor.
Figure 5B:
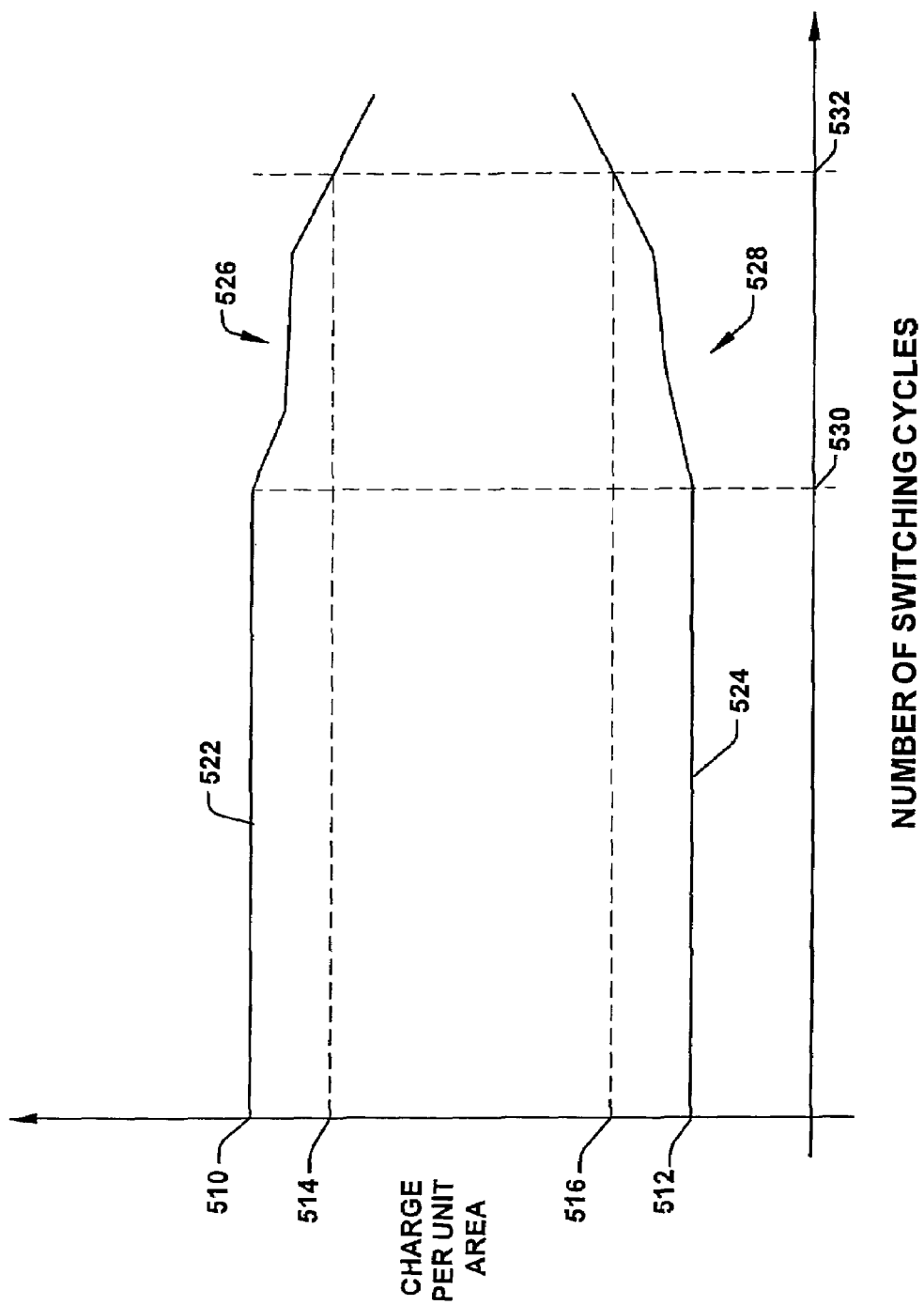
FIG. 5B is a graph that illustrates the polarization performance of the ferroelectric capacitor as a function of read/write cycles.

FIG. 5A illustrates a graph 500 showing polarization in uC/cm2 vs. applied electric field in kV/cm for an exemplary ferroelectric capacitor. A first curve 504 illustrates the polarization performance of an unstressed ferroelectric capacitor and a second curve 506 illustrates the ferroelectric capacitor after a number of read/write cycles and/or amount of time. FIG. 5B provides a graph 520 that illustrates the polarization performance (positive and negative directions) of the ferroelectric capacitor as a function of read/write cycles. The ferroelectric capacitor initially attains a positive residual polarization value 510 and a negative value 512 along the positive portion 526 and the negative portion 528 of curves 522 and 524, respectively.

Generally, after an integer number of cycles 530 an onset of fatigue is noticeable in both curves 522 and 524. Thereafter, along portions 526 and 528, the positive and negative polarization performance degrades. At a number of cycles 532, the positive polarization drops to a value 514 and the negative polarization drops to a value 516, which are below proper operational levels for the ferroelectric capacitor (e.g., when signal read margin falls below a predetermined level). It is noted that, generally, the greater the initial polarization values 510 and 512, the more switching cycles may be performed until the minimal values 514 and 516 are reached. As a result, the greater the initial polarization values, the longer the data retention lifetime for the ferroelectric capacitor and memory cell.

Figure 6:
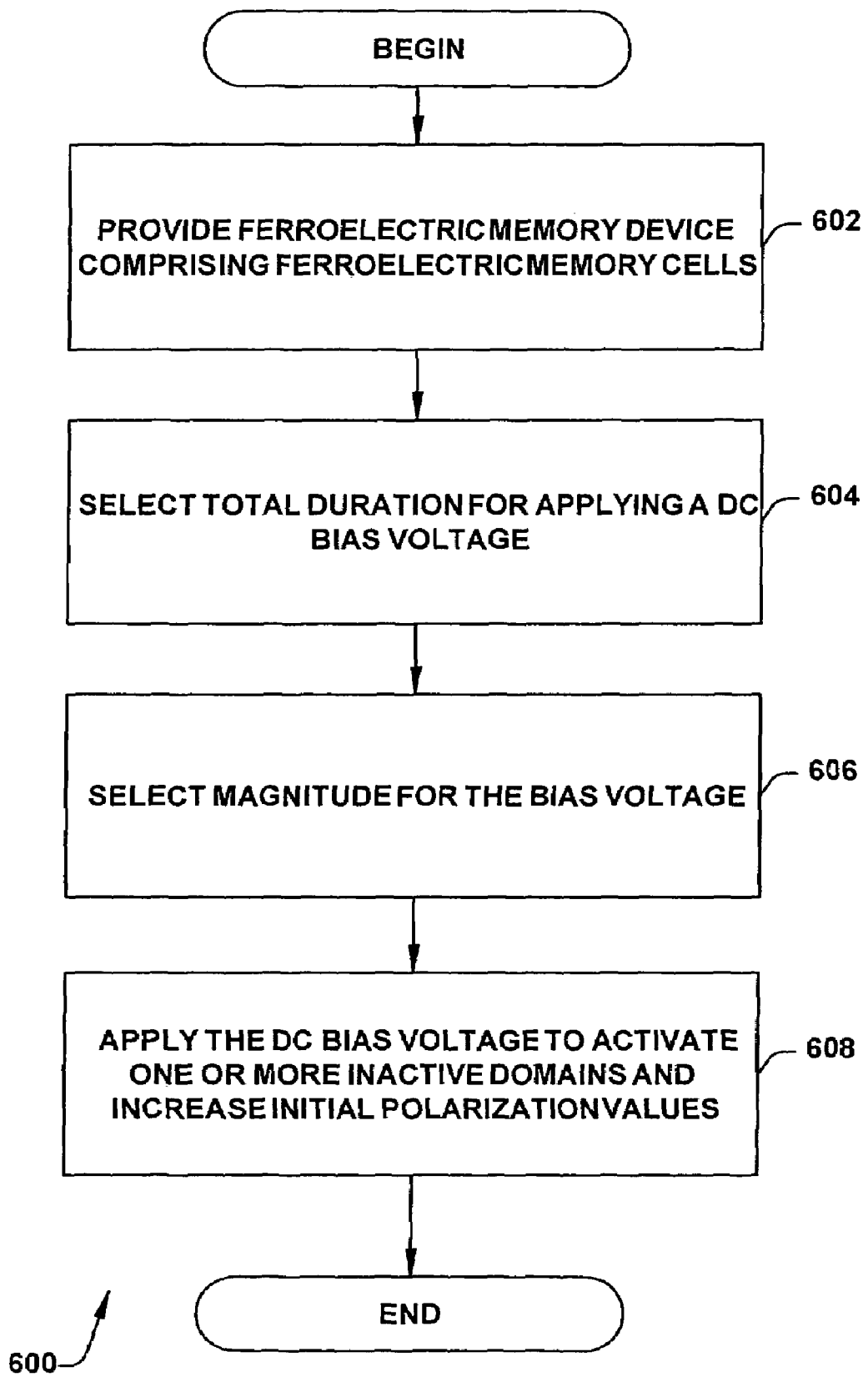
FIG. 6 is a flow diagram illustrating a method for applying a DC bias across ferroelectric capacitors of ferroelectric memory cells for a relatively long period of time to increase initial polarization values in accordance with an aspect of the present invention.

FIG. 6 is a flow diagram illustrating a method 600 for applying a DC bias across ferroelectric capacitors of ferroelectric memory cells for a relatively long period of time to increase initial polarization values in accordance with an aspect of the present invention.

Figure 2:
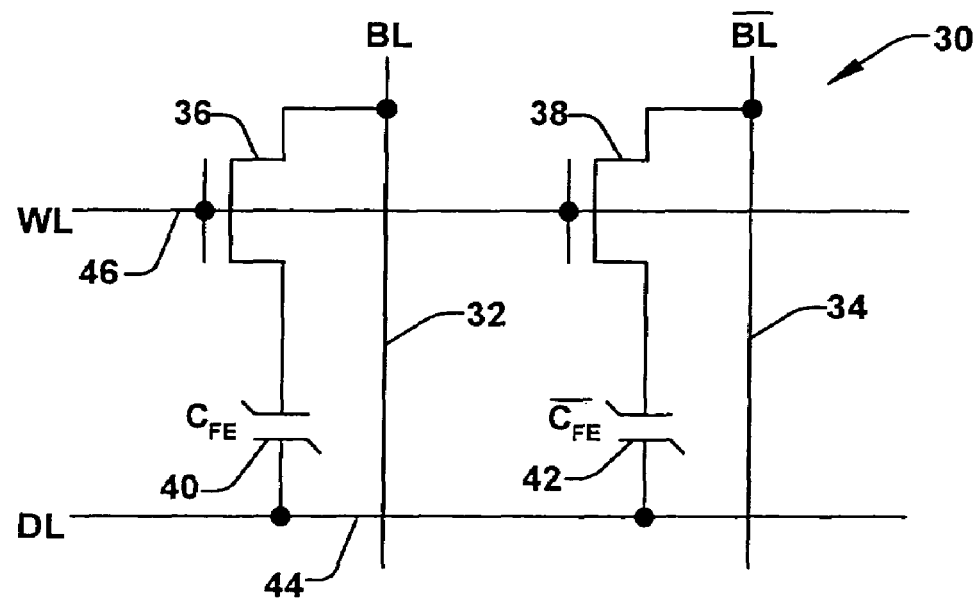
FIG. 2 is a schematic view of a conventional 2T/2C FRAM cell.

The method 600 begins at block 602, wherein a ferroelectric memory device comprising ferroelectric memory cells is provided. The ferroelectric memory cells comprise ferroelectric capacitors comprised of a ferroelectric material, such as, but not limited to, $Pb(Zr,Ti)O_3$ (PZT), $(Ba,Sr)TiO_3$ (BST), $SrTiO_3$ (STO) and $SrBi_2Ta_2O_9$ (SBT), $BaTiO_3$ (BTO), $(Bi_{1-x}La_x)_4Ti_3O_{12}$ (BLT), or other ferroelectric material, fabricated between two conductive electrodes. Generally, one of the electrodes is connected to a drive line or plate line and the other is selectably connected to a bitline or bitline bar, such as shown in FIGS. 1 and 2.

A relatively long duration for an applied DC bias is selected at block 604. The duration is typically at least a second and is considerably longer than typical programming operations, which are insufficient to convert inactive domains within the ferroelectric material into active domains. Generally, the longer the DC bias duration, the more improvement in activated domains and, therefore, in initial polarization obtained. One or more factors are considered in selecting the relatively long duration including, but not limited to, initial polarization improvement desired, desired data retention lifetimes, allowable test time, production levels, and the like.

A bias amount or magnitude for the applied DC bias is selected at block 606. The bias amount or magnitude affects the number of domains that can be activated by the applied DC bias. Generally, the higher the bias amount, the more improvement in activated domains and, therefore, in initial polarization obtained. It is noted that beyond a certain bias amount, the memory cells can become damaged. As with the duration, one or more factors are considered in selecting the bias amount including, but not limited to, initial polarization improvement desired, desired data retention lifetimes, allowable test time, production levels, and the like. It is noted that blocks 604 and 606 can be performed in either order. Furthermore, it is noted that the bias amount and duration are interrelated and, therefore, can be selected in relation to each other.

Continuing with the method 600, the DC bias voltage is applied at block 608 at the selected bias amount for the selected relatively long duration that activates one or more inactive domains present within the ferroelectric capacitors and increases initial polarization values. Generally, the DC bias voltage is applied across the ferroelectric capacitors by applying the voltage across the electrodes by way of the plateline/driveline and the bitline while selecting the control transistors with wordlines. For example, the DC bias voltage can be applied to a 1T1C ferroelectric capacitor by asserting a wordline and connecting a first terminal of the ferroelectric capacitor to a bitline. Then, a positive voltage is connected to the bitline while the plateline/driveline is connected to ground. Alternately, the positive voltage can be connected to the plateline/driveline and the bitline can be connected to ground.

Figure 7:
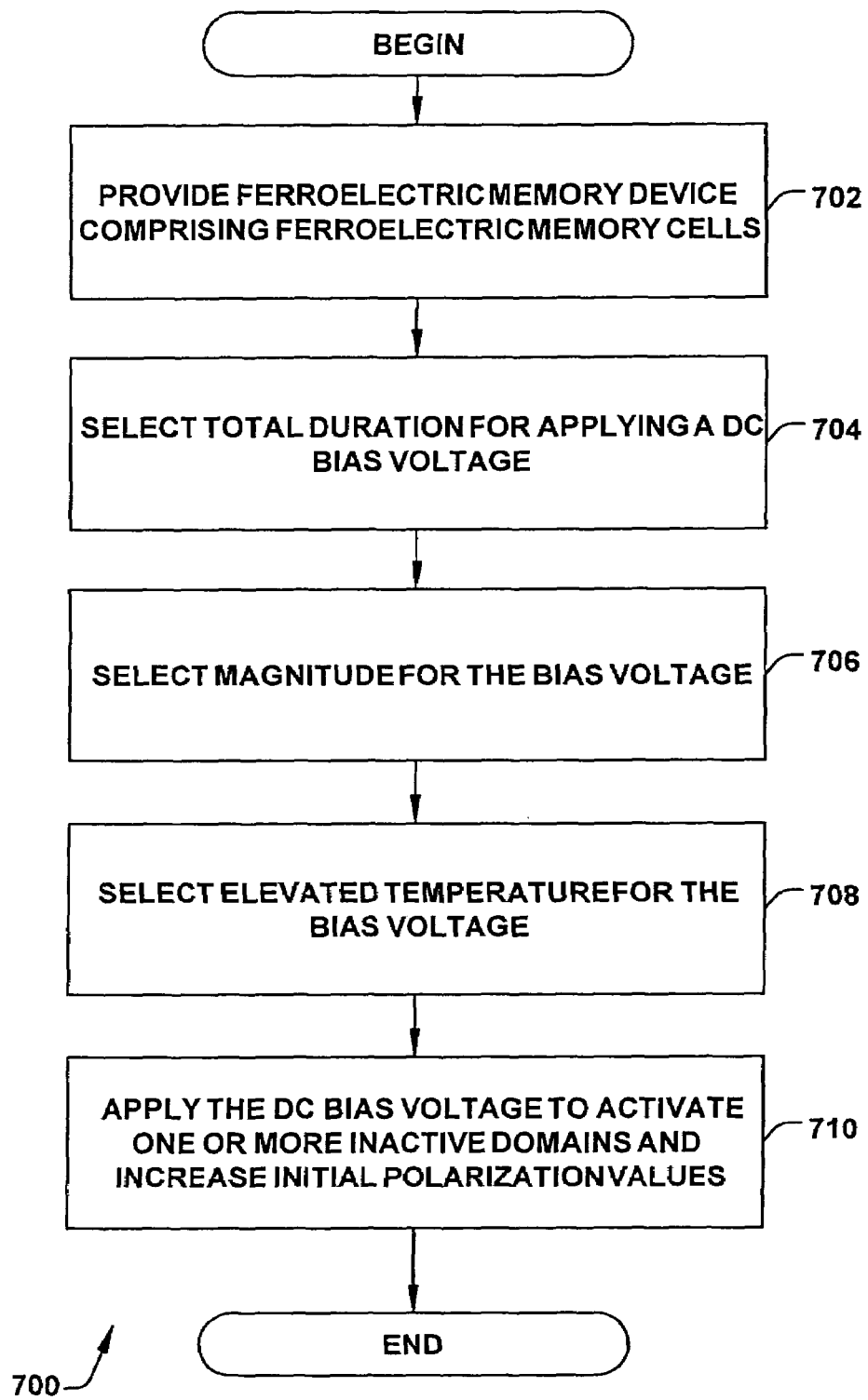
FIG. 7 is a flow diagram illustrating a method for applying a DC bias across ferroelectric capacitors of ferroelectric memory cells for a relatively long period of time at an elevated temperature to increase initial polarization values in accordance with an aspect of the present invention.

FIG. 7 is a flow diagram illustrating a method 700 for applying a DC bias across ferroelectric capacitors of ferroelectric memory cells for a relatively long period of time at an elevated temperature to increase initial polarization values in accordance with an aspect of the present invention.

The method 700 begins at block 702, wherein a ferroelectric memory device comprising ferroelectric memory cells is provided. The ferroelectric memory cells comprise ferroelectric capacitors comprised of a ferroelectric material, such as, but not limited to, $Pb(Zr,Ti)O_3$ (PZT), $(Ba,Sr)TiO_3$ (BST), $SrTiO_3$ (STO) and $SrBi_2Ta_2O_9$ (SBT), $BaTiO_3$ (BTO), $(Bi_{1-x}La_x)_4Ti_3O_{12}$ (BLT), or other ferroelectric material, fabricated between two conductive electrodes. Generally, one of the electrodes is connected to a drive line or plate line and the other is selectably connected to a bitline or bitline bar, such as shown in FIGS. 1 and 2.

A relatively long duration for an applied DC bias is selected at block 704. The duration is typically at least a second and can be greater. Generally, the longer the duration, the more improvement in activated domains and, therefore, in initial polarization obtained. One or more factors are considered in selecting the relatively long duration including, but not limited to, initial polarization improvement desired, desired data retention lifetimes, allowable test time, production levels, and the like.

A bias amount for the applied DC bias is selected at block 706. The bias amount affects the number of domains that can be activated by the applied DC bias. Generally, the higher the bias amount, the more improvement in activated domains and, therefore, in initial polarization obtained. It is noted that beyond a certain bias amount, the memory cells can become damaged. An example of a suitable bias amount is about 1.3 to 1.5 volts. As with the duration, one or more factors are considered in selecting the bias amount including, but not limited to, initial polarization improvement desired, desired data retention lifetimes, allowable test time, production levels, and the like.

An elevated temperature for the DC bias is selected at block 708. The elevated temperature also affects the number of domains that can be activated by the DC bias. Generally, the higher the elevated temperature, the more improvement in activated domains and, therefore, in initial polarization obtained. It is noted that temperatures beyond an upper limit are typically avoided in order to mitigate thermal damage to the device. As with the duration and bias amount, one or more factors are considered in selecting the elevated temperature amount including, but not limited to, thermal budget, initial polarization improvement desired, desired data retention lifetimes, allowable test time, production levels, and the like.

It is noted that blocks 704, 706, and 708 can be performed in other orders in accordance with the present invention. For example, selection of the elevated temperature at block 708 can be performed prior to the selection of duration at block 704. Furthermore, it is noted that the bias amount, duration, and elevated temperature are interrelated and, therefore, can be selected in relation to each other.

Continuing with the method 700, the DC bias voltage is applied at block 710 at the selected bias amount for the selected relatively long duration and at the selected elevated temperature that activates one or more inactive domains present within the ferroelectric capacitors and increases initial polarization values. Generally, the DC bias voltage is applied across the ferroelectric capacitors by applying the voltage across the electrodes by way of the plateline/driveline and the bitline while selecting the control transistors with wordlines.

Figure 8:
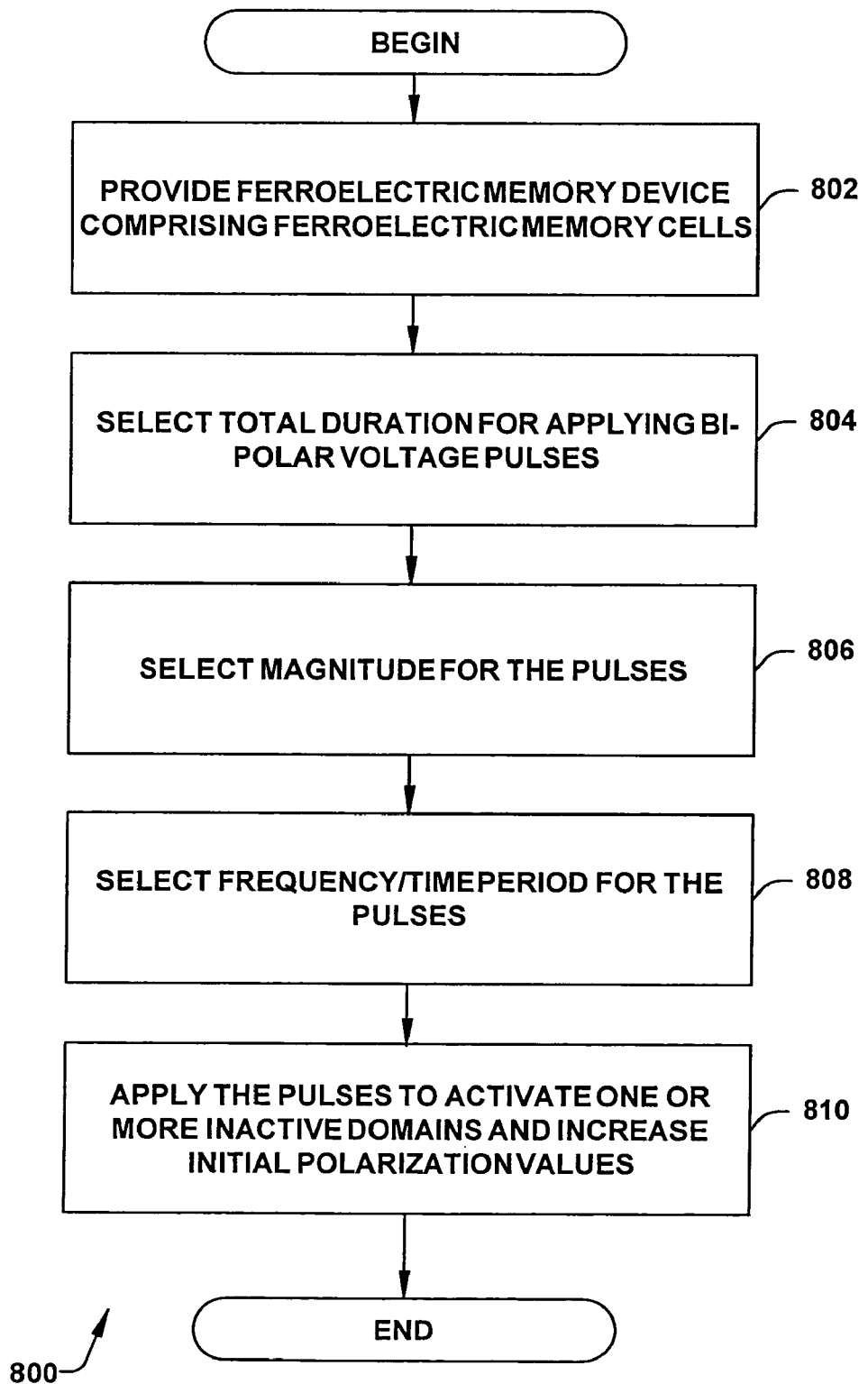
FIG. 8 is a flow diagram illustrating a method for applying DC pulses across ferroelectric capacitors to increase initial polarization values in accordance with an aspect of the present invention.

FIG. 8 is a flow diagram illustrating a method 800 for applying DC pulses across ferroelectric capacitors to increase initial polarization values in accordance with an aspect of the present invention.

A ferroelectric memory device comprising ferroelectric memory cells is provided at block 802. The ferroelectric memory cells comprise ferroelectric capacitors comprised of a ferroelectric material, such as, but not limited to, $Pb(Zr,Ti)O_3$ (PZT), $(Ba,Sr)TiO_3$ (BST), $SrTiO_3$ (STO) and $SrBi_2Ta_2O_9$ (SBT), $BaTiO_3$ (BTO), $(Bi_{1-x}La_x)_4Ti_3O_{12}$ (BLT), or other ferroelectric material, fabricated between two conductive electrodes. Generally, as with the previous methods, one of the electrodes is connected to a drive line or plate line and the other is selectably connected to a bitline or bitline bar, such as shown in FIGS. 1 and 2.

A duration for applying pulses, typically a number of cycles, is selected at block 804. The duration is typically at least a second and can be greater. Generally, the longer the duration, the more improvement in activated domains and, therefore, in initial polarization obtained. One or more factors are considered in selecting the relatively long duration including, but not limited to, initial polarization improvement desired, desired data retention lifetimes, allowable test time, production levels, and the like.

An amount or magnitude for the pulses is selected at block 806. The amount affects the number of domains that can be activated by the applied pulse. Generally, the higher the amount, the more improvement in activated domains and, therefore, in initial polarization obtained. It is noted that beyond a certain amount, the memory cells can become damaged. As with the duration, one or more factors are considered in selecting the bias amount including, but not limited to, initial polarization improvement desired, desired data retention lifetimes, allowable test time, production levels, and the like.

A frequency or time period for the pulses is selected at block 808. The frequency selected can depend upon one or more factors including, but not limited to, film thickness, chemistry of the ferroelectric capacitors employed, previous experimental data, temperature and the like. An example of a suitable frequency that improves polarization is 100 kHz.

It is appreciated that other characteristics of the pulse, such as duty cycle, pulse shape, and the like, can also be selected according to the one or more factors described above.

Generally, shorter pulses (higher frequency) require more cycles to attain improvement and wider pulse widths (lower frequency) require less cycles to attain improvement. Additionally, the amount of improvement obtained can vary according to the frequency selected. Testing and experimental data are examples of suitable mechanisms that can be employed to select the frequency that yields a desired improvement. As an example, 100 nsec pulses may take up to about 3E9 cycles to attain a desired polarization improvement whereas about 5 msec pulses take only about 5E6 cycles to attain the same desired polarization improvement.

It is noted that blocks 804, 806, and 808 can be performed in other orders in accordance with the present invention. For example, selection of the frequency at block 808 can be performed prior to the selection of duration at block 804. Furthermore, it is noted that the amount, duration, and frequency can be interrelated and, therefore, can be selected in relation to each other.

Continuing with the method 800, the pulses are then applied at block 810 at the selected amount for the selected duration and at the selected frequency thereby activating one or more inactive domains present within the ferroelectric capacitors and increasing initial polarization values. Typically, the pulses are applied across the ferroelectric capacitors by applying the pulses across the electrodes by way of the plateline/driveline and the bitline while selecting the control transistors with wordlines.

Figure 9:
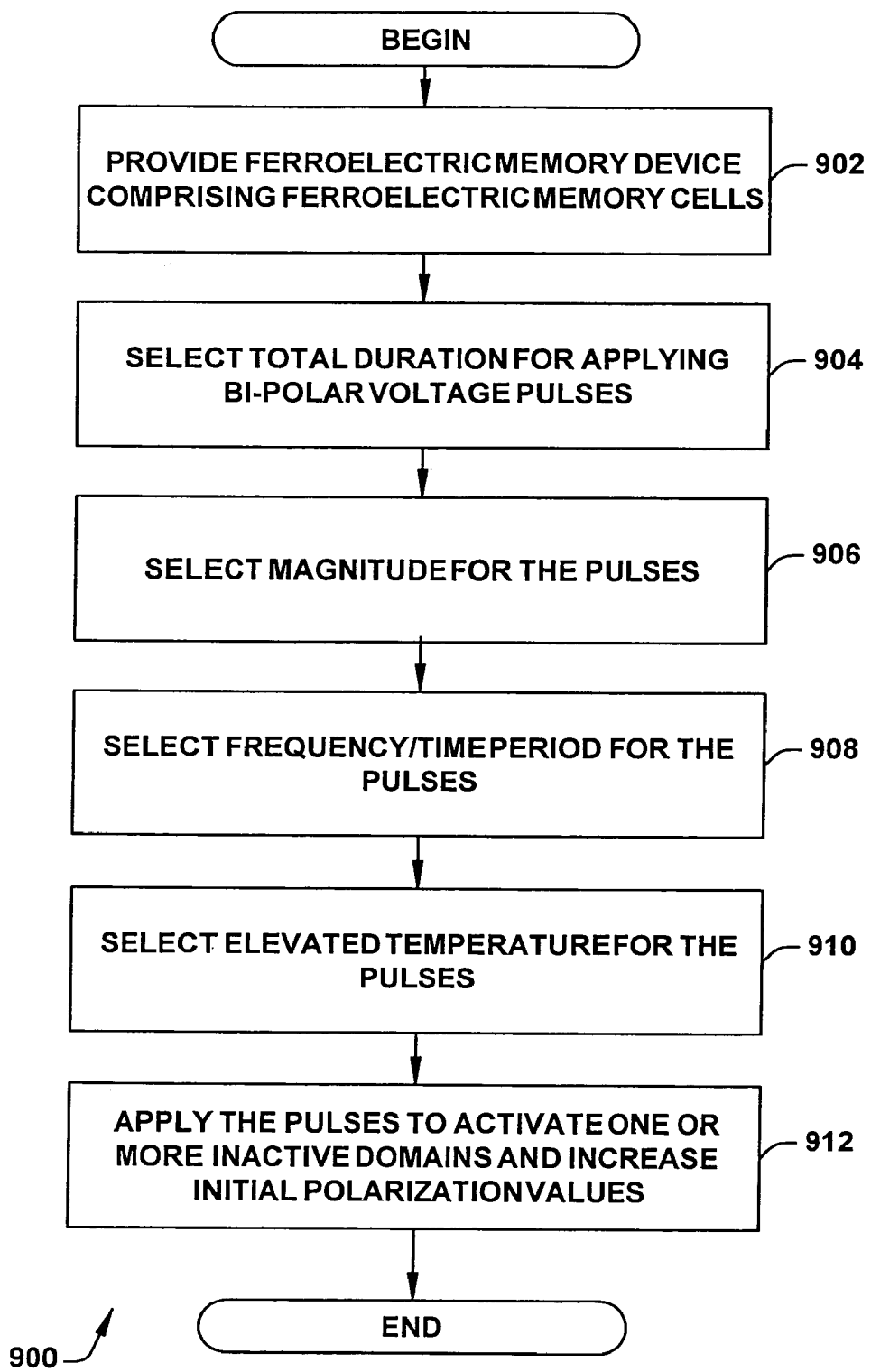
FIG. 9 is a flow diagram illustrating a method for applying DC pulses across ferroelectric capacitors at an elevated temperature to increase initial polarization values in accordance with an aspect of the present invention.

FIG. 9 is a flow diagram illustrating a method 900 for applying DC pulses across ferroelectric capacitors at an elevated temperature to increase initial polarization values in accordance with an aspect of the present invention.

A ferroelectric memory device comprising ferroelectric memory cells is provided at block 902. The ferroelectric memory cells comprise ferroelectric capacitors comprised of a ferroelectric material, such as, but not limited to, $Pb(Zr,Ti)O_3$ (PZT), $(Ba,Sr)TiO_3$ (BST), $SrTiO_3$ (STO) and $SrBi_2Ta_2O_9$ (SBT), $BaTiO_3$ (BTO), $(Bi_{1-x}La_x)_4Ti_3O_{12}$ (BLT), or other ferroelectric material, fabricated between two conductive electrodes. Generally, as with the previous methods, one of the electrodes is connected to a drive line or plate line and the other is selectably connected to a bitline or bitline bar, such as shown in FIGS. 1 and 2.

A duration for applying pulses is selected at block 904. The duration is typically at least a second and can be greater and is typically a fixed number of cycles. Generally, the longer the duration, the more improvement in activated domains and, therefore, in initial polarization obtained. One or more factors are considered in selecting the relatively long duration including, but not limited to, initial polarization improvement desired, desired data retention lifetimes, allowable test time, production levels, and the like.

An amount or magnitude for the pulses is selected at block 906. The amount affects the number of domains that can be activated by the applied pulse. Generally, the higher the amount, the more improvement in activated domains and, therefore, in initial polarization obtained. It is noted that beyond a certain amount, the memory cells can become damaged. As with the duration, one or more factors are considered in selecting the bias amount including, but not limited to, initial polarization improvement desired, desired data retention lifetimes, allowable test time, production levels, and the like.

A frequency or time period for the pulses is selected at block 908. The frequency selected can depend upon one or more factors including, but not limited to, film thickness, chemistry of the ferroelectric capacitors employed, previous experimental data, temperature and the like. Typically, the pulses are approximately square wave pulses where polarity of an applied DC voltage is reversed every half cycle. However, alternate aspects of the invention can include other types and/or shapes of pulses. Further, it is appreciated that other characteristics of the pulse, such as duty cycle, pulse shape, and the like, can also be selected according to the one or more factors described above.

An elevated temperature for the pulses is selected at block 910. As with the previous methods, the elevated temperature also affects the number of domains that can be activated by the pulse, when applied. Generally, the higher the elevated temperature, the more improvement in activated domains and, therefore, in initial polarization obtained. It is noted that temperatures beyond an upper limit are typically avoided in mitigate thermal damage to the device. As with the duration and bias amount, one or more factors are considered in selecting the elevated temperature amount including, but not limited to, thermal budget, initial polarization improvement desired, desired data retention lifetimes, allowable test time, production levels, and the like.

It is noted that blocks 904, 906, 908, and 910 can be performed in other orders in accordance with the present invention. For example, selection of the elevated temperature at block 910 can be performed prior to the selection of frequency at block 908. Furthermore, it is noted that the amount, duration, frequency, and elevated temperature can be interrelated and, therefore, can be selected in relation to each other.

Subsequently, the pulses are then applied at block 912 at the selected amount, for the selected duration, at the selected frequency, and at the selected elevated temperature thereby activating one or more inactive domains present within the ferroelectric capacitors and increasing initial polarization values. Generally, the pulses are applied across the ferroelectric capacitors by applying the pulses across the electrodes by way of the plateline/driveline and the bitline while selecting the control transistors with wordlines.

Figure 10:
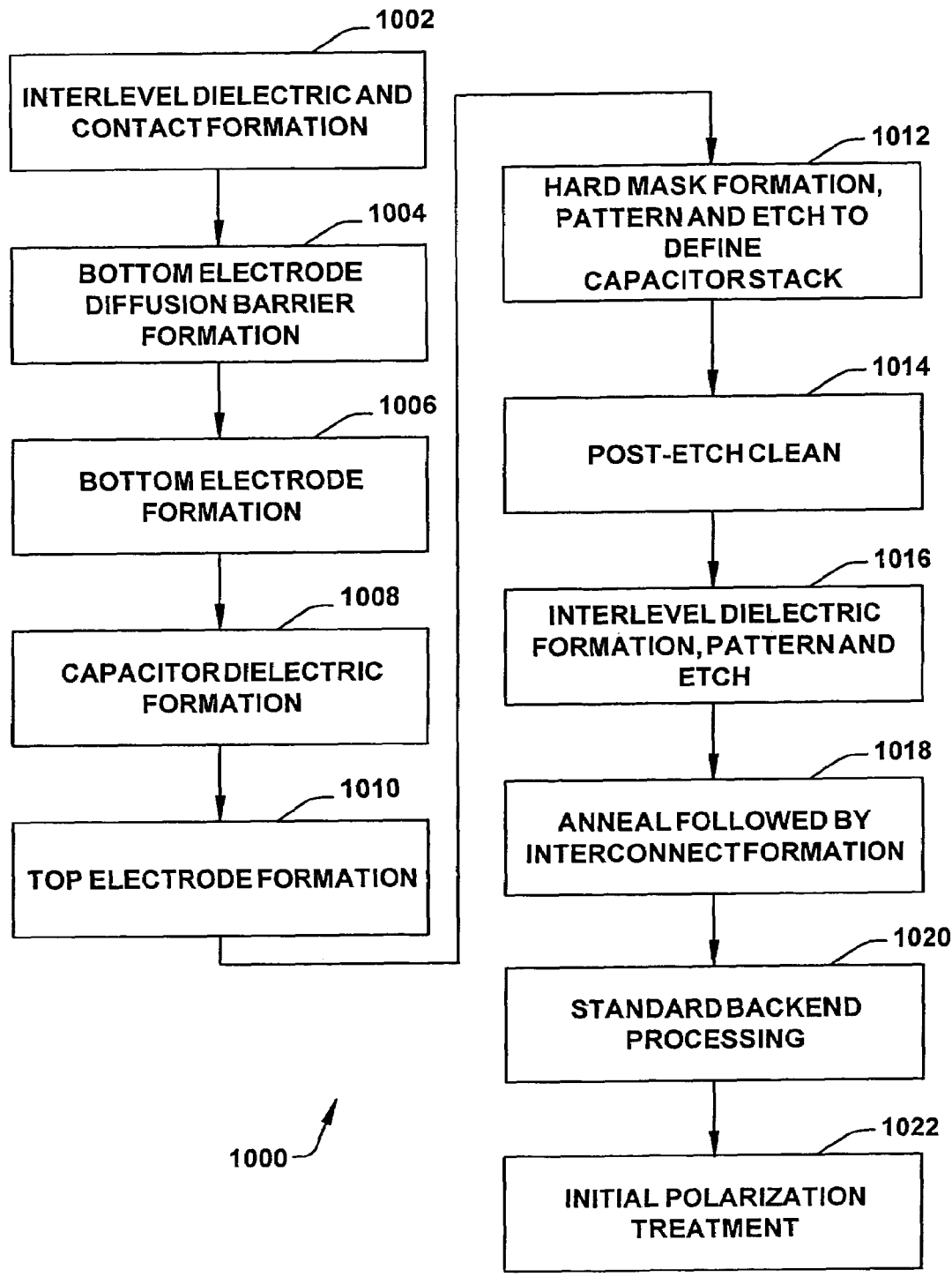
FIG. 10 is a flow diagram illustrating a method of forming a semiconductor device having a ferroelectric capacitor in accordance with an aspect of the present invention.

Turning now to FIG. 10, a flow diagram is provided illustrating a method 1000 of forming a semiconductor device having a ferroelectric capacitor in accordance with an aspect of the present invention. The method 1000 operates on a device that has undergone standard front end processing.

Beginning at block 1002, an interlevel dielectric layer is formed and conductive contacts (e.g., tungsten (W) contacts) are formed therein with a barrier layer (e.g., TiN) disposed therebetween to avoid oxidation of the tungsten contacts. Formation of the interlayer dielectric and the contacts may be formed by various means and any such process is contemplated as falling within the scope of the present invention. Subsequently, the FRAM capacitor(s) are formed over the interlayer dielectric and the contacts.

A bottom electrode diffusion barrier layer is formed over the interlevel dielectric and the contact(s) at block 1004. The bottom electrode diffusion layer is comprised of a suitable material and is formed so as to have a low resistivity. Some exemplary materials suitable for the bottom electrode diffusion barrier layer include, TiAlON, TaSiN, TiSiN, TaAlN, Ti, TiN, Ta, TaN, HfN, ZrN, HfAlN, CrN, TaAlN, CrAlN, and the like. A suitable deposition technique for the bottom electrode diffusion barrier layer include reactive sputter deposition using $Ar+N_2$ or $Ar+NH_3$. Other deposition techniques that might be used include CVD or plasma enhanced CVD.

It is appreciated that a cleaning operation can be performed prior to formation of the bottom electrode diffusion barrier layer. For example, one option is to sputter clean with Ar prior to the deposition of the bottom electrode diffusion barrier layer. This pre-clean occur without a vacuum break prior to the deposition of the barrier.

A bottom electrode is formed over the bottom electrode diffusion barrier layer at block 1006. This layer should remain stable during subsequent processing and formation of the ferroelectric dielectric layer. For example, with a PZT ferroelectric, reliability is improved with oxide electrodes. The electrode experiences the thermal budget and oxidizing conditions of the ferroelectric deposition and possibly anneal. Therefore the bottom electrode is desirably stable in oxygen and does not form insulating layers as a result of such oxygen. It is also advantageous that the bottom electrode at least partially impedes the oxidation and reaction of the underlying diffusion barrier.

In addition, the bottom electrode preferably maintains a relatively low contact resistance. A list of possible materials includes Pt, Pd, PdOx, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, $LaNiO_3$.

The bottom electrode can be formed via a number of suitable techniques. For example, the bottom electrode can be formed by a putter deposition for Ir (Ar) and/or reactive sputter deposition $(Ar+O_2)$ for IrOx, which work well with PZT ferroelectric materials.

A ferroelectric dielectric layer is formed on the bottom electrode at block 1008. The ferroelectric dielectric layer is comprised of a ferroelectric material such as $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$ etc. PZT is frequently chosen the capacitor dielectric because it has the highest polarization and the lowest processing temperature of the aforementioned materials. Thin PZT (<100 nm) is extremely advantageous in making integration more simple (less material to etch) and less expensive (less material to deposit therefore less precursor). Because PZT has the largest switched polarization, it is also possible to minimize capacitor area using such material.

The ferroelectric dielectric layer can be formed by a deposition process such as metal organic chemical vapor deposition (MOCVD). MOCVD is preferred especially for thin films (<100 nm). MOCVD also permits the film thickness to be scaled without significant degradation of switched polarization and coercive field, yielding PZT films with a low operating voltage and large polarization values. In addition, the reliability of the MOCVD PZT film is better than that generally obtained using other deposition techniques, particularly with respect to imprint/retention.

Continuing at block 1010, a top electrode is formed over the ferroelectric dielectric layer. The top electrode can be comprised of one or more individual layers. The top electrode can be comprised of materials similar to those employed for the bottom electrode. Some suitable materials for the top electrode include, iridium oxide and iridium.

In particular it is advantageous for Pb based ferroelectrics to have a conductive oxide top electrode such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ rather than a noble metal in order to minimize degradation due to many opposite state write/read operations (fatigue). Many of the Bi ferroelectrics such as SBT can also use noble metal electrodes such as Pt, Pd, Au, Ag, Ir, Rh, and Ru and still retain good fatigue characteristics.

If the top electrode is an oxide, it is generally advantageous to have a noble metal layer above it in order to maintain low contact resistance between the top metal contact and oxide. For example, it is possible that a TiN in contact with IrOx might form $TiO_2$ during subsequent thermal processes, which is insulating. For any electrode using an expensive noble metal such as Pt, Ru, Pd, or Ir it is advantageous from a cost and integration standpoint to use as thin of layer as possible. The top electrode can be formed via a variety of suitable deposition processes, such as a physical vapor deposition process.

At block 1012, a hard mask is formed followed by a patterning process that defines a capacitor stack. The hard mask is comprised of a suitable material that is resistant to developer such as silicon dioxide or a silicon rich material and retains its integrity during the capacitor stack etch process. The hard mask is formed so as to be thick enough to facilitate patterning of the deposited layers to form the capacitor stack.

Continuing at block 1014, a post patterning process is performed to remove unwanted remnants of the patterning process (e.g., developer, resist, and the like). The pattern and etch processes can introduce contaminants to the capacitor stack and the semiconductor device. After a patterning process, it is likely that the etch tool and the front side, edge and backside of the wafers will have FRAM contamination or have etch residues with FRAM contamination. It is therefore desirable to clean the front side of the wafer and chemically remove etch residues and possibly remove a thin layer of damaged PZT. This post capacitor etch wet clean can, with some etch conditions and chemistries, be as simple as a DI water clean (tank soak with or without megasonic followed by a spin rinse dry) or the tank etch might be acid based in order to improve the clean or remove more damage. One exemplary acid solution might be similar to SC1 or SC2 (possibly without peroxide but may be with ozone), for example ($NH_4F+O_3+H_2O$ or $NH_4F+H_2O_2+HCl+H_2O$: 1/1/1/300) in order to also assist in particle removal plus metal contamination removal).

The backside and edges of the wafer can be significantly contaminated by re-deposition of FRAM elements. The contamination is preferably removed prior to process in a shared tool. One method to remove the backside chemistry is to use a specialized tool such as a backside clean tool (e.g., as made by SEZ). Even hard to etch materials such as Ir can be removed if they are sub monolayer coverage by undercutting the etching of the material on the backside. Other suitable solutions and/or methods can be employed to remove unwanted remnants of the patterning process and still be in accordance with the present invention. A sidewall diffusion barrier layer is generally formed that encapsulates the capacitor stack.

At block 1016, an interlevel dielectric layer is deposited and/or formed over the device and vias are formed in the interlevel dielectric layer to provide electrical connections to the top electrode and other contacts. The interlevel dielectric layer is comprised of a suitable materials, such as, $SiO_2$, FSG, PSG, BPSG, PETEOS, HDP oxide, a silicon nitride, silicon oxynitride, silicon carbide, silicon carbo-oxy-nitride, a low dielectric constant material (preferably SiLK, porous SiLK, teflon, low-K polymer (possibly porous), aerogel, xerogel, BLACK DIAMOND, HSQ, or any other porous glass material), or a combination or stack thereof. The interlevel dielectric layer can then be planarized (e.g., chemical mechanical planarization).

After the interlevel dielectric layer is formed, vias are formed to make electrical connection to the top electrode and to the contacts. Standard semiconductor processing techniques can be utilized to form the vias. The vias are formed without etching a significant amount of the underlying material (W, TiN and $SiO_2$ at the contacts) and hard mask etch stop layer (TiAlON or TiON) on top of the capacitors under a few preferred embodiments. SiN etch processes with these characteristics have been developed and the etch selectivity to TiAlON has been documented to be very good. This result is useful since the SiN etch rate on the capacitor is expected to faster and the SiN is also expected to be thinner compared to at the contacts which is deeper.

An anneal process is performed followed by interconnect formation at block 1018 so as to remove damage introduced by the capacitor stack processing (such as the ferroelectric material etch, encapsulation, and contact etch) into the capacitor dielectric and to improve the electrical properties of these features. If this anneal is not done at this point (i.e. if the anneal is done with the PZT stack exposed on its sidewalls), then it may result in the loss of Pb near the perimeter of each capacitor. This loss in Pb in the PZT film will result in the degradation of the electrical properties of small capacitors (capacitors with large perimeter to area ratios) after the capacitor integration.

The anneal of the instant invention is, generally, performed after the interlevel dielectric is formed and the via holes patterned and etched, but prior to the filling of the vias with the conductive material. After this anneal is performed, the via diffusion barrier (liner) and conductor are formed using standard semiconductor processing techniques. The conductor is either W with TiN diffusion barrier or more preferably Cu with TaN, TaSiN, Ta, TiN, WN, or TiSiN diffusion barrier deposited by enhanced sputter deposition or more preferably CVD. The Cu is deposited by first depositing a Cu seed by enhanced sputter deposition or CVD preferably followed by Cu electroplating in order to fill the via. A standard semiconductor processing approach after the deposition of the metal in the via is to remove the metal on the top surface by etch back (W) or CMP (W and Cu). Another alternative is that metal layer above the via is formed using dual damascene process along with the via. The disadvantage of this approach results is a substantial increase in process complexity. Standard back end processing can then be performed at 1020 to complete a process fabrication stage of the semiconductor device.

After fabrication, a post-process treatment of the memory device is performed at block 1022, which includes improving initial polarization values for memory cells within the device. A DC bias or a DC pulse can be applied as described with respect to the methods 600, 700, 800, and 900 of FIGS. 6, 7, 8, and 9, respectively. It is appreciated that variations of these methods are contemplated for the method 1000. The improved initial polarization values are typically selected to attain a desired data retention lifetime. It is contemplated that the treatment applied at block 1022 can be re-applied if the desired data retention lifetime is not identified from subsequent lifetime tests.

It is also appreciated that variations of the method 1000 are contemplated and included in the present invention. For example, variations in process procedures, etching, depositing, and the like can occur and still be in accordance with the present invention.

FIGS. 6–10, described above, serve to illustratively provide methods of fabricating ferroelectric memory devices with modified/improved initial polarization values and, therefore, data retention lifetimes in accordance with the present invention. Additionally, the inventors of the present invention note that other suitable mechanisms can be incorporated in accordance with the present invention to also modify data retention. Process development and modification can be performed to reduce defects that lead to loss of signal margin and data retention. Material selection and dopant selection can be adjusted to compensate for defects in processing or fabrication to reduce a rate of imprint or reduce establishing a preferential state. Architectures, such as 2T/2C can be employed that are less vulnerable to imprinting.

FIGS. 11–15, described below, are provided to further illustrate the present invention by demonstrating experimental results obtained for switched polarization improvement treatments in accordance with the present invention. The present invention is not limited to the demonstrated behavior/results and contemplates that permissible variations in methods of the present invention and differing device characteristics generally yield different results, such as more or less switched polarization improvement. FIGS. 11–15 are exemplary in nature and merely illustrate possible results/improvements by employing the present invention and are not intended to illustrate limits of the present invention.

Figure 11:
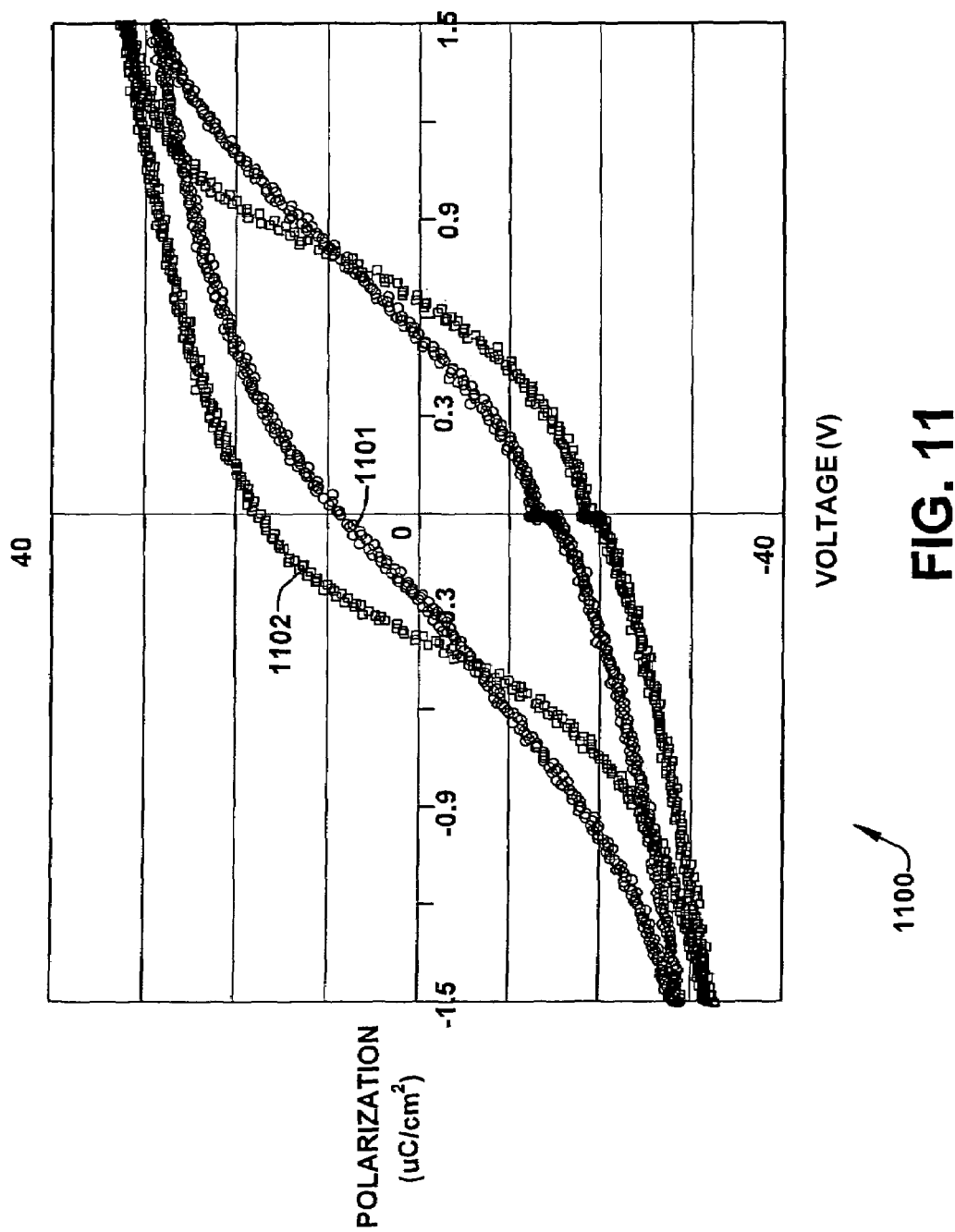
FIG. 11 is a graph illustrating exemplary hysteresis loops for a ferroelectric memory cell in accordance with an aspect of the present invention.

FIG. 11 is a graph 1100 illustrating exemplary hysteresis loops for a ferroelectric memory cell in accordance with an aspect of the present invention. A y-axis represents polarization in uC/cm$^2$ and an x-axis represents applied voltage in volts.

A switched polarization treatment is performed on the ferroelectric memory cell that comprises applying a DC bias voltage of about 1.2 volts at an elevated temperature of 150 degrees Celsius for a duration of about one hour. Line 1101 depicts polarization performance versus applied voltage for the ferroelectric memory cell prior to the switched polarization treatment. Line 1102 depicts polarization performance versus applied voltage for the ferroelectric memory cell after the switched polarization treatment of the present invention. It can be seen that the hysteresis loop has widened considerably and yields, in this example, greater than an 80% increase in switched polarization. As a result of this increased switch polarization, a data retention lifetime for the ferroelectric memory cell has been lengthened.

Figure 12:
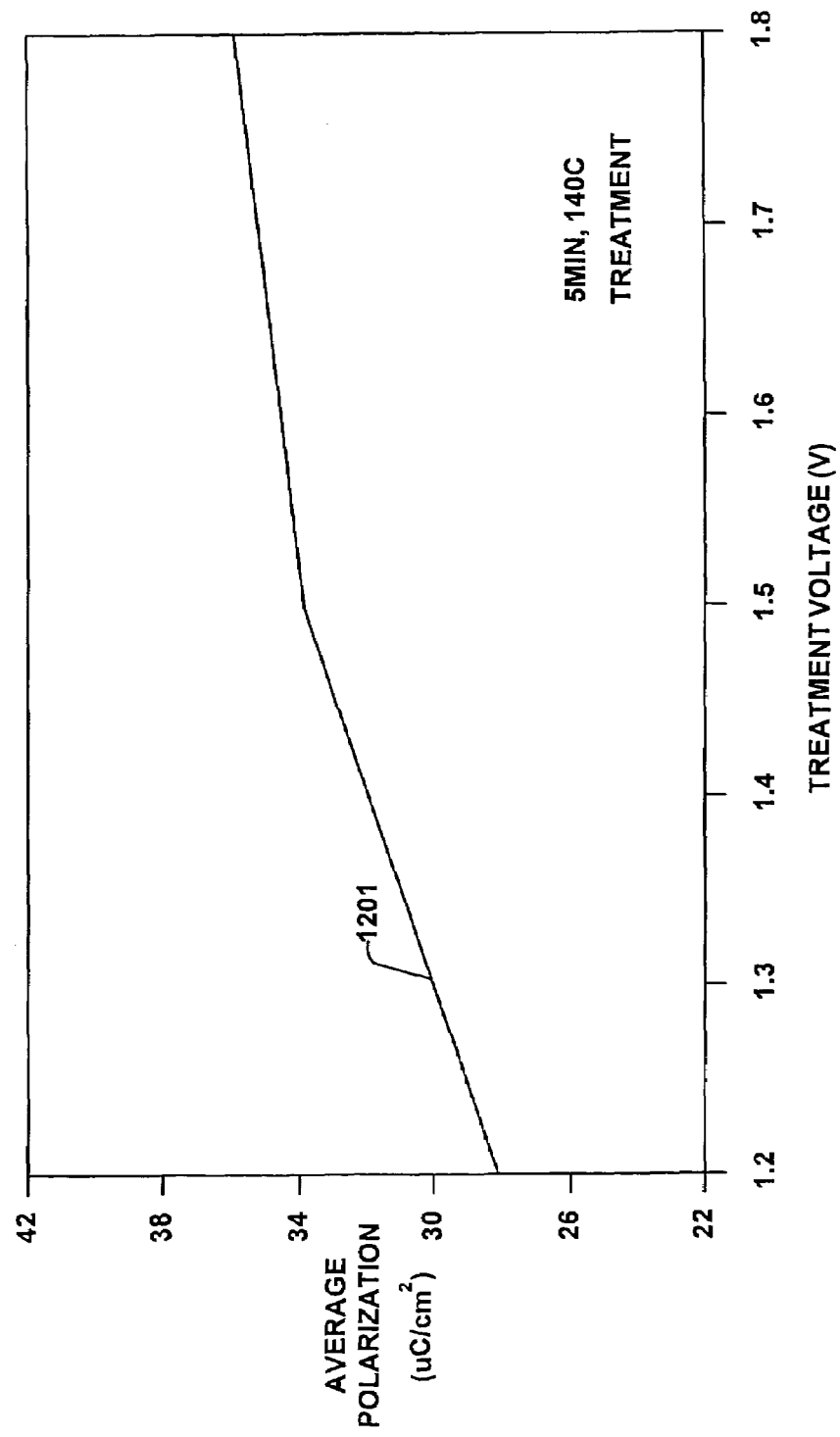
FIG. 12 is a graph illustrating variations in average switched polarization for ferroelectric memory cells according to treatment voltage in accordance with an aspect of the present invention.

FIG. 12 is a graph 1200 illustrating variations in average switched polarization for ferroelectric memory cells according to treatment voltage in accordance with an aspect of the present invention. An x-axis represents treatment voltage or applied DC bias voltage in volts and a y-axis represents average polarization in uC/cm$^2$. Fixed parameters for the switched polarization treatment are an elevated temperature of 140 degrees Celsius and a duration for applying a DC bias voltage of about 5 minutes. The applied DC bias voltage is varied from about 1.2 volts to about 1.8 volts in this example.

Line 1201 depicts the measured average polarization for the ferroelectric memory cells after undergoing switched polarization treatments of varied applied DC bias voltage and at the temperature of 140 degrees Celsius and the duration of about 5 minutes. It can be seen from the line 1201 that the average polarization increases in response to higher voltage amounts.

Figure 13:
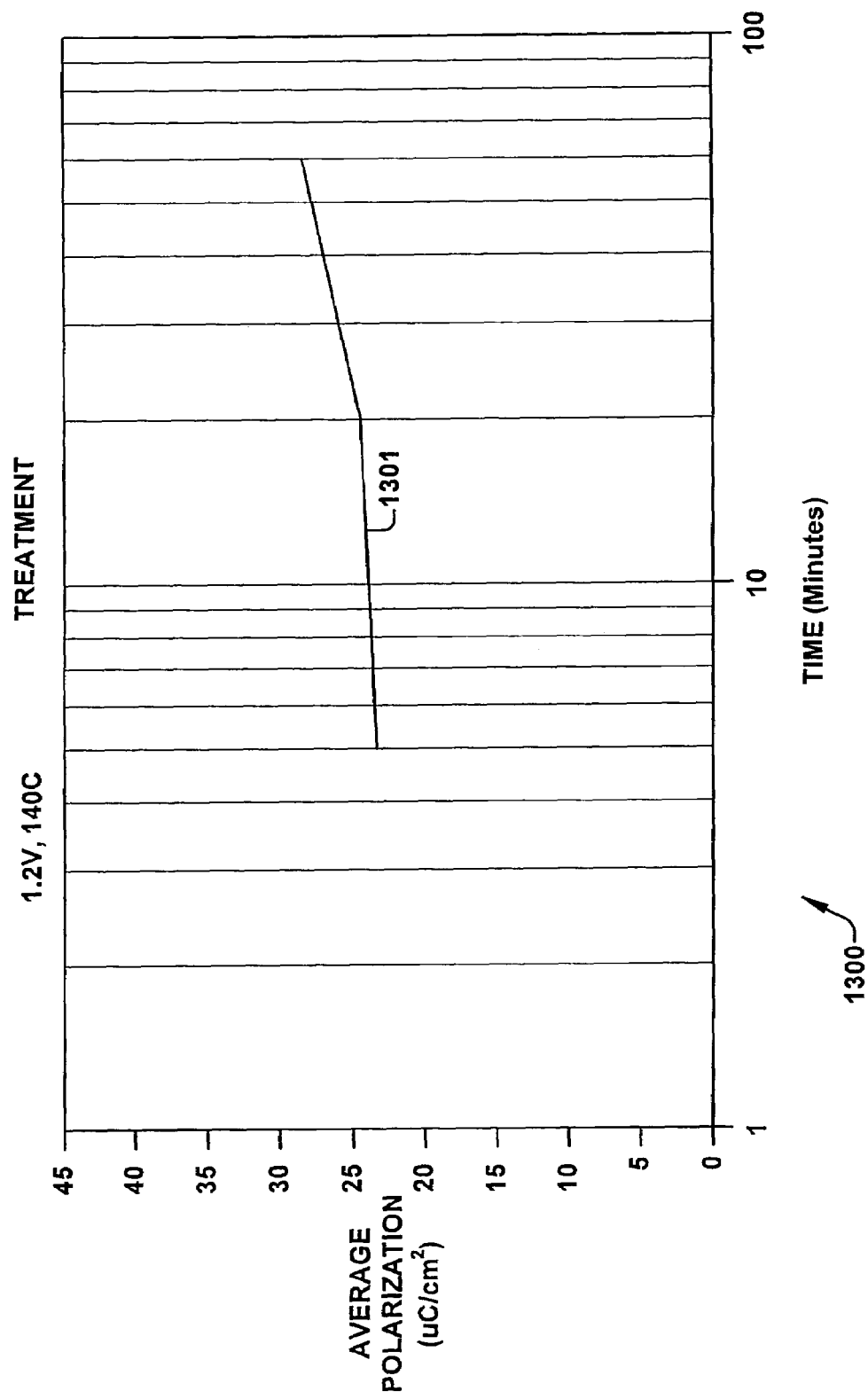
FIG. 13 is a graph illustrating variations in duration for switched polarization treatments for ferroelectric memory cells in accordance with an aspect of the present invention.

FIG. 13 is a graph 1300 illustrating variations in duration for switched polarization treatments for ferroelectric memory cells in accordance with an aspect of the present invention. An x-axis represents duration in minutes, logarithmically, and a y-axis represents average polarization in uC/cm$^2$. Fixed parameters for the switched polarization treatment are an elevated temperature of 140 degrees Celsius and an applied DC bias of about 1.2 volts. The duration is varied from 1 to 100 minutes.

Line 1301 depicts the measured average polarization for the ferroelectric memory cells after undergoing switched polarization treatments of varied durations and at the temperature of 140 degrees Celsius and an applied DC bias voltage of 1.2 volts. It can be seen from the line 1301 that the average polarization increases in response to longer durations.

Figure 14:
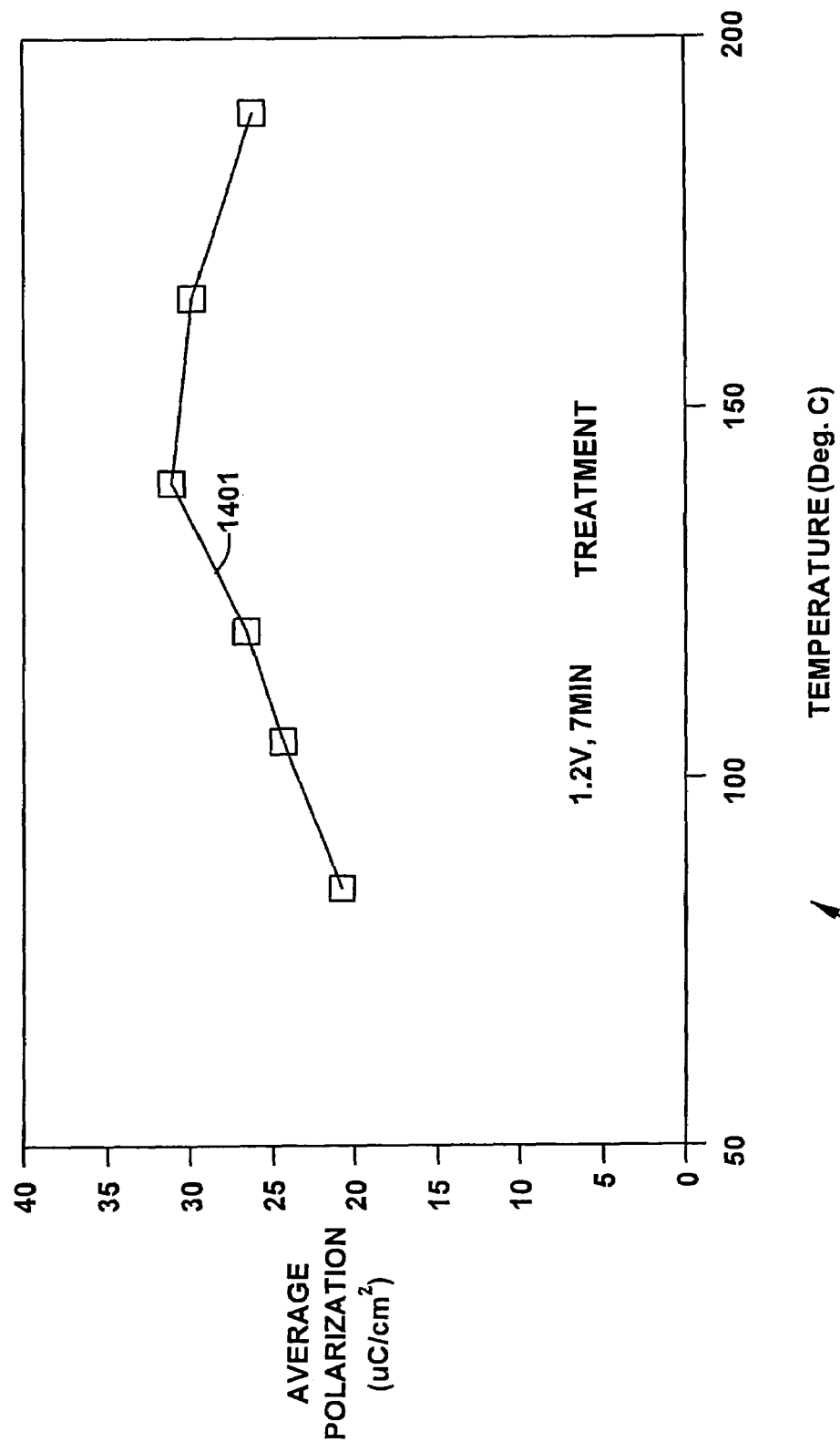
FIG. 14 is a graph illustrating variations in elevated temperatures for polarization treatments for ferroelectric memory cells in accordance with an aspect of the present invention.

FIG. 14 is a graph 1400 illustrating variations in elevated temperatures for switched polarization treatments for ferroelectric memory cells in accordance with an aspect of the present invention. An x-axis represents temperature in degrees Celsius and a y-axis represents average polarization in uC/cm$^2$. Fixed parameters for the switched polarization treatment are an applied DC bias of about 1.2 volts and a duration of about 7 minutes. The temperature is varied from about 50 degrees Celsius to about 200 degrees Celsius.

Line 1401 depicts the measured average polarization for the ferroelectric memory cells after undergoing switched polarization treatments of varied temperatures. It can be seen from the line 1401 that the average polarization generally increases in response to higher temperatures, but does decrease slightly after a certain point.

Figure 15:
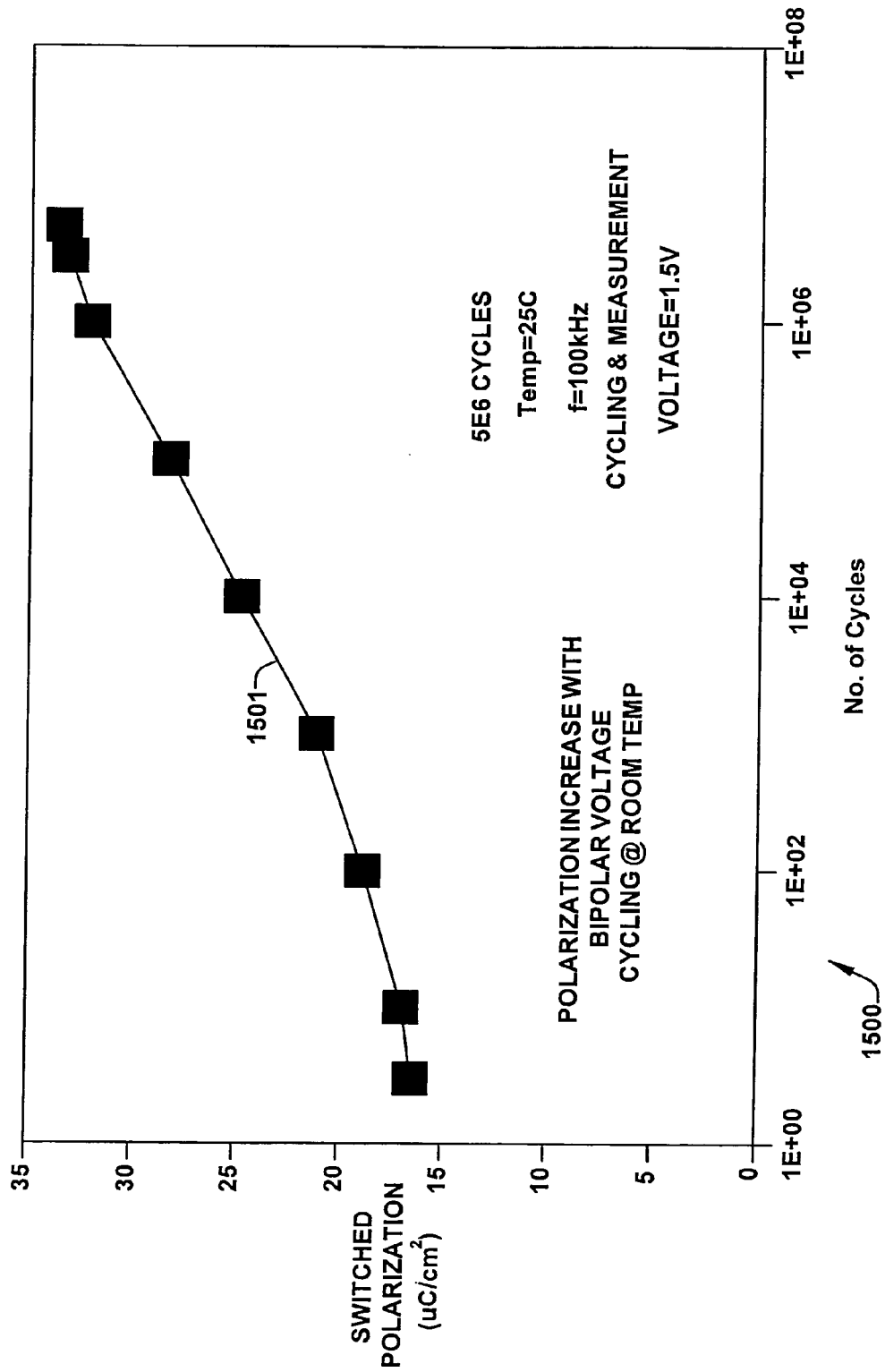
FIG. 15 is a graph illustrating variations in cycles or duration for polarization treatments employing pulses for ferroelectric memory cells in accordance with an aspect of the present invention.

FIG. 15 is a graph 1500 illustrating variations in cycles or duration for switched polarization treatments employing pulses for ferroelectric memory cells in accordance with an aspect of the present invention. An x-axis represents a number of pulse cycles performed and a y-axis represents switched polarization in uC/cm$^2$. Fixed parameters for the switched polarization treatment are a temperature of about 25 degrees Celsius (room temperature), a frequency of about 100 kHz, and a pulse bias amount of 1.5 volts.

Line 1501 depicts the measured switched polarization for the ferroelectric memory cells after undergoing switched polarization treatments with increasing numbers of cycles. It can be seen from the line 1501 that the average polarization generally increases as the number of cycles/duration increases.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method of modifying switched polarization for ferroelectric memory devices comprising:
fabricating a ferroelectric memory device having arrays of memory cells comprising ferroelectric capacitors comprising ferroelectric material, wherein the ferroelectric material comprises one or more inactive domains;
selecting a duration for a polarization treatment according to a desired switched polarization improvement;
selecting a magnitude for the polarization treatment according to the desired switched polarization improvement; and
applying the polarization treatment to the memory cells of the ferroelectric memory device according to the selected duration and the selected magnitude to activate at least a portion of the one or more inactive domains and increase initial switched polarization values of the memory cells.

2. The method of claim 1, further comprising:
determining a desired data retention lifetime for the memory cells of the ferroelectric memory device; and
selecting the duration and the magnitude according to the desired data retention lifetime.

3. The method of claim 2, wherein the determined data retention lifetime is 10 years of continuous use at 105 degrees Celsius.

4. The method of claim 1, wherein fabricating the ferroelectric memory device comprises fabricating a ferroelectric capacitor comprised of a bottom electrode, a top electrode, and a ferroelectric material the respective memory cells.

5. The method of claim 4, wherein the ferroelectric material is $Pb(Zr,Ti)O_3$ (PZT).

6. The method of claim 1, further comprising selecting an elevated temperature according to a desired switched polarization improvement and applying the polarization treatment further according to the selected elevated temperature.

7. The method of claim 6, wherein the selected elevated temperature is selected from a range comprising about 120 degrees Celsius to about 180 degrees Celsius.

8. The method of claim 1, wherein the selected magnitude is selected from a range comprising about 1.0 volts to about 2.0 volts.

9. The method of claim 1, wherein the duration is selected from a range comprising about 5 seconds to about 60 minutes.

10. The method of claim 1, wherein the polarization treatment comprises applying a DC bias voltage of the selected magnitude for the selected duration to the memory cells.

11. The method of claim 1, wherein the polarization treatment comprises applying pulses of the selected magnitude for the selected duration to the memory cells.

12. The method of claim 11, further comprising selecting a frequency for the pulses according to the desired switched polarization improvement.

13. A method of modifying switched polarization for ferroelectric memory cells comprising:
providing the ferroelectric memory cells comprising ferroelectric capacitors, wherein the ferroelectric capacitors comprise ferroelectric material containing inactive domains;
selecting a duration for applying a DC bias voltage according to duration factors;
selecting a bias amount for applying the DC bias voltage according to bias factors;
selecting an elevated temperature for applying the DC bias voltage according to temperature factors; and
activating one or more inactive domains of the ferroelectric capacitors by applying the DC bias voltage across the ferroelectric capacitors according to the selected duration, the selected bias amount, and the selected elevated temperature.

14. The method of claim 13, wherein the duration factors comprise desired switched polarization improvement, desired data retention lifetimes, and allowable test time.

15. The method of claim 13, wherein the temperature factors comprise desired switched polarization improvement, desired data retention lifetimes, and a thermal budget.

16. The method of claim 13, wherein the duration is about 5 seconds, the elevated temperature is about 140 degrees Celsius, and the bias amount is about 1.4 volts.

17. A method of modifying switched polarization for ferroelectric memory cells comprising:
providing the ferroelectric memory cells comprising ferroelectric capacitors;
selecting a number of pulses according to a desired switched polarization improvement;
selecting a magnitude of the pulses according to bias factors; and
applying the pulses according to the selected number and the selected magnitude across the ferroelectric capacitors.

18. The method of claim 17, wherein applying the pulses further comprises applying the pulses at room temperature.

19. The method of claim 17, wherein applying the pulses further comprises applying the pulses at an elevated temperature.

20. The method of claim 17, further comprising selecting a frequency for the pulses according to the desired switched polarization.

* * * * *